US010471734B2

(12) United States Patent
Kondo

(10) Patent No.: US 10,471,734 B2
(45) Date of Patent: Nov. 12, 2019

(54) LIGHT EMITTING COMPONENT, PRINT HEAD AND IMAGE FORMING APPARATUS

(71) Applicant: FUJI XEROX CO., LTD., Tokyo (JP)

(72) Inventor: Takashi Kondo, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/775,808

(22) PCT Filed: Mar. 10, 2017

(86) PCT No.: PCT/JP2017/009835
§ 371 (c)(1),
(2) Date: May 11, 2018

(87) PCT Pub. No.: WO2017/169670
PCT Pub. Date: Oct. 5, 2017

(65) Prior Publication Data
US 2018/0309890 A1    Oct. 25, 2018

(30) Foreign Application Priority Data

Mar. 29, 2016   (JP) ................................. 2016-066816

(51) Int. Cl.
*B41J 2/447*    (2006.01)
(52) U.S. Cl.
CPC .................... *B41J 2/447* (2013.01)
(58) Field of Classification Search
CPC ....... G03G 15/04054; G03G 15/04036; G03G 15/043; H05B 37/02; H01S 5/0261;
(Continued)

(56) References Cited

U.S. PATENT DOCUMENTS 3,942,028 A * 3/1976 Baker ....................... H02J 9/06
307/66
4,082,923 A * 4/1978 Okuhara ................ H04Q 3/521
340/2.29
(Continued)

FOREIGN PATENT DOCUMENTS

JP    H01-238962 A    9/1989
JP    H10-321957 A    12/1998
(Continued)

OTHER PUBLICATIONS

May 16, 2017 Search Report issued in International Patent Application No. PCT/JP2017/009835.
(Continued)

*Primary Examiner* — Negussie Worku
(74) *Attorney, Agent, or Firm* — Oliff PLC

(57) ABSTRACT

A light emitting component includes: plural transfer devices that successively come into ON state; plural setting thyristors that are connected to the plural transfer devices, respectively, and come into a state of being able to shift to ON state by the transfer devices coming into ON state; and plural light emitting devices that are connected to the plural setting thyristors in series, respectively, and emit light or increase in light emission amounts when the setting thyristors come into ON state, and the setting thyristors are formed so as to comprise a voltage reducing layer having a bandgap smaller than bandgaps of light emitting layers of the light emitting devices.

20 Claims, 19 Drawing Sheets

(58) Field of Classification Search
CPC .. H01S 5/0427; H01S 5/18308; H01S 5/2205; H01S 5/2222; H01S 5/3095; H01S 5/3216; H01S 5/4031; H01S 5/423; H01S 5/042; H01S 5/12; H01S 5/125; H01S 5/2215; H01S 5/343; H01S 5/34326; H01S 5/34333; H01S 5/4087; G01B 9/02004; G01B 9/02007; G01B 9/02091; G02B 26/10; H04B 10/503; H04B 10/506; H04J 14/08; H04J 3/0682; H04N 1/0282; H04N 1/00891; H01L 33/06; H01L 33/62; H01L 29/74; H01L 33/10; H01L 27/15; H01L 27/153; H01L 29/201; H01L 29/8605; H01L 33/08; H01L 33/105; H01L 33/145; H01L 33/30; H01L 29/41716
USPC ......................................... 358/474, 475, 509
See application file for complete search history.

(56) References Cited

U.S. PATENT DOCUMENTS

| | | |
|---|---|---|
| 5,451,977 A | 9/1995 | Kusuda et al. |
| 5,814,841 A | 9/1998 | Kusuda et al. |
| 10,218,173 B2 * | 2/2019 | Jamali .................. H02J 3/01 |
| 2009/0297223 A1 | 12/2009 | Suzuki |
| 2010/0231682 A1 * | 9/2010 | Ohno ................ B41J 2/451 347/238 |
| 2012/0249712 A1 * | 10/2012 | Ohno .................. B41J 2/45 347/118 |
| 2017/0277065 A1 * | 9/2017 | Kondo ............ G03G 15/04054 |
| 2018/0031362 A1 * | 2/2018 | Kondo ............... G01B 9/02007 |
| 2018/0034578 A1 * | 2/2018 | Kondo ................. H04B 10/506 |
| 2018/0309890 A1 * | 10/2018 | Kondo ................... B41J 2/447 |

FOREIGN PATENT DOCUMENTS

| | | |
|---|---|---|
| JP | 2001-308385 A | 11/2001 |
| JP | 2005-340471 A | 12/2005 |
| JP | 2009-286048 A | 12/2009 |
| JP | 2013-168581 A | 8/2013 |
| JP | 2015-032812 A | 2/2015 |
| JP | 2016-039338 A | 3/2016 |

OTHER PUBLICATIONS

May 16, 2017 Written Opinion issued in International Patent Application No. PCT/JP2017/009835.

* cited by examiner

FIG. 8
(a)
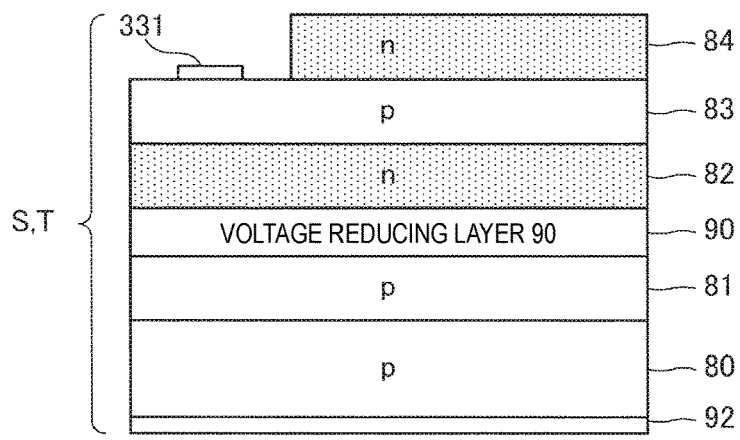
(b)
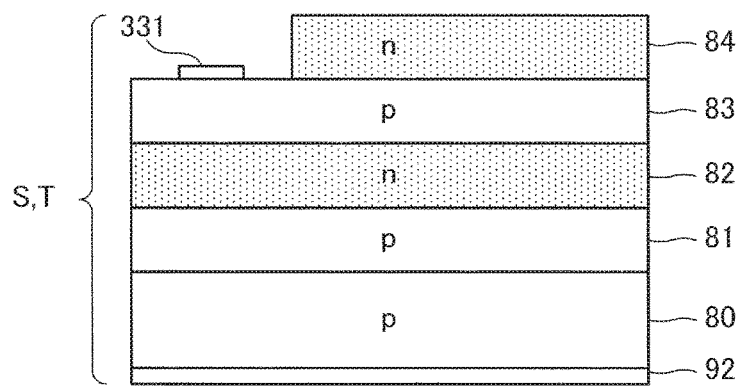
(c)
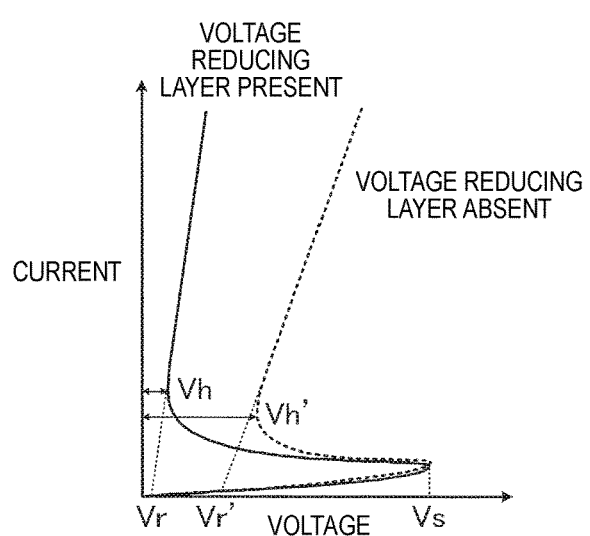

LIGHT EMITTING COMPONENT, PRINT HEAD AND IMAGE FORMING APPARATUS

CROSS-REFERENCE TO RELATED APPLICATIONS

This application is based on and claims priority under 35 USC 119 from Japanese Patent Application No. 2016-066816 filed on Mar. 29, 2016.

BACKGROUND

Technical Field

The present invention relates to a light emitting component, a print head and an image forming apparatus.

SUMMARY

According to an aspect of the invention, there is provided a light emitting component comprising: a plurality of transfer devices that successively come into ON state; a plurality of setting thyristors that are connected to the plurality of transfer devices, respectively, and come into a state of being able to shift to ON state by the transfer devices coming into ON state; and a plurality of light emitting devices that are connected to the plurality of setting thyristors in series, respectively, and emit light or increase in light emission amounts when the setting thyristors come into ON state, wherein the setting thyristors are formed so as to include a voltage reducing layer having a bandgap smaller than bandgaps of light emitting layers of the light emitting devices.

BRIEF DESCRIPTION OF DRAWINGS

Exemplary embodiments of the present invention will be described in detail based on the following figures, wherein:

FIG. 8 is views explaining the structure of the thyristor and the characteristic of the thyristor, in which (a) is a cross-sectional view of the thyristor according to the first exemplary embodiment provided with a voltage reducing layer, (b) is a cross-sectional view of the thyristor not provided with the voltage reducing layer, and (c) is the thyristor characteristic;

DETAILED DESCRIPTION

Hereinafter, referring to the attached drawings, exemplary embodiments of the present invention will be described in detail.

In the following, atomic symbols will be used for denotation such as referring to aluminum as Al.

First Exemplary Embodiment (Image Forming Apparatus 1)

Figure 1:
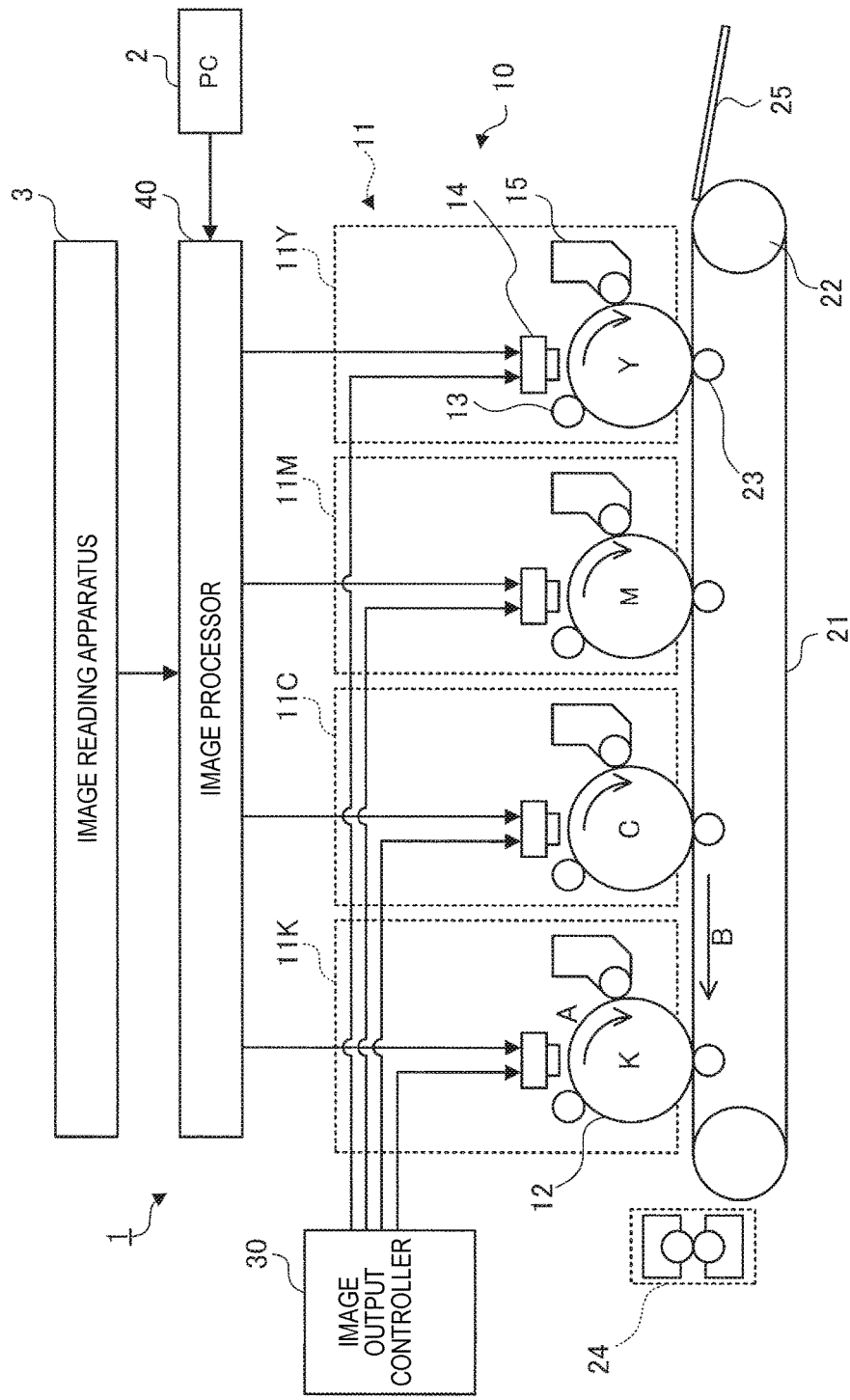
FIG. 1 is a view showing an example of the general structure of an image forming apparatus to which a first exemplary embodiment is applied.

FIG. 1 is a view showing an example of the general structure of an image forming apparatus 1 to which a first exemplary embodiment is applied. The image forming apparatus 1 shown in FIG. 1 is an image forming apparatus that is generally called a tandem type. This image forming apparatus 1 is provided with: an image forming process portion 10 that performs image formation in accordance with the image data of each color; an image output controller 30 that controls the image forming process portion 10; and an image processor 40 that is connected, for example, to a personal computer (PC) 2 and an image reading apparatus 3 and performs predetermined image processing on the image data received therefrom.

The image forming process portion 10 is provided with image forming units 11Y, 11M, 11C and 11K (referred to as the image forming unit 11 when not distinguished from one anther) disposed in parallel at predetermined intervals. The image forming unit 11 is provided with: a photoreceptor drum 12 as an example of the image carrier that forms an electrostatic latent image and carries a toner image; a charger 13 as an example of the charging portion that charges the surface of the photoreceptor drum 12 at a predetermined potential; a print head 14 that exposes the photoreceptor drum 12 charged by the charger 13; and a developer 15 as an example of the developing portion that develops the electrostatic latent image obtained by the print head 14. The image forming units 11Y, 11M, 11C and 11K form toner images of yellow (Y), magenta (M), cyan (C) and black (K), respectively.

Moreover, the image forming process portion 10 is provided with: a sheet conveying belt 21 that conveys a recording sheet 25 as an example of the transfer object in order to perform the multiple transfer of the toner images of the colors formed by the photoreceptor drums 12 of the image forming units 11Y, 11M, 11C and 11K onto this recording sheet 25; driving rolls 22 that drive the sheet conveying belt 21; transfer rolls 23 as an example of the transfer portions that transfer the toner images on the photoreceptor drums 12 onto the recording sheet 25; and a fixer 24 that fixes the toner images to the recording sheet 25.

In this image forming apparatus 1, the image forming process portion 10 performs an image forming operation based on various control signals supplied from the image output controller 30. Then, under the control of the image output controller 30, the image data received from the personal computer (PC) 2 or the image reading apparatus 3 undergoes image processing by the image processor 40, and is supplied to the image forming units 11. Then, for example, at the image forming unit 11K of black (K), the photoreceptor drum 12 is charged to a predetermined potential by the charger 13 while rotating in the direction of the arrow A, and is exposed by the print head 14 that emits light based on the image data supplied from the image processor 40. Thereby, an electrostatic latent image related to a black (K) image is formed on the photoreceptor drum 12. Then, the electrostatic latent image formed on the photoreceptor drum 12 is developed by the developer 15, so that a toner image of black (K) is formed on the photoreceptor drum 12. At the image forming units 11Y, 11M and 11C, toner images of the colors of yellow (Y), magenta (M) and cyan (C) are formed, respectively.

The toner images of the colors on the photoreceptor drums 12 formed by the image forming units 11 are electrostatically transferred in succession by the transfer electric field applied to the transfer rolls 23 onto the recording sheet 25 supplied with the movement of the sheet conveying belt 21 moving in the direction of the arrow B, whereby a synthesized toner image where the toners of the colors are superimposed is formed on the recording sheet 25.

Thereafter, the recording sheet 25 where the synthesized toner image has been electrostatically transferred is conveyed up to the fixer 24. The synthesized toner image on the recording sheet 25 having been conveyed to the fixer 24 is fixed onto the recording sheet 25 by undergoing fixing processing with heat and pressure by the fixer 24, and is discharged from the image forming apparatus 1.

(Print Head 14)

Figure 2:
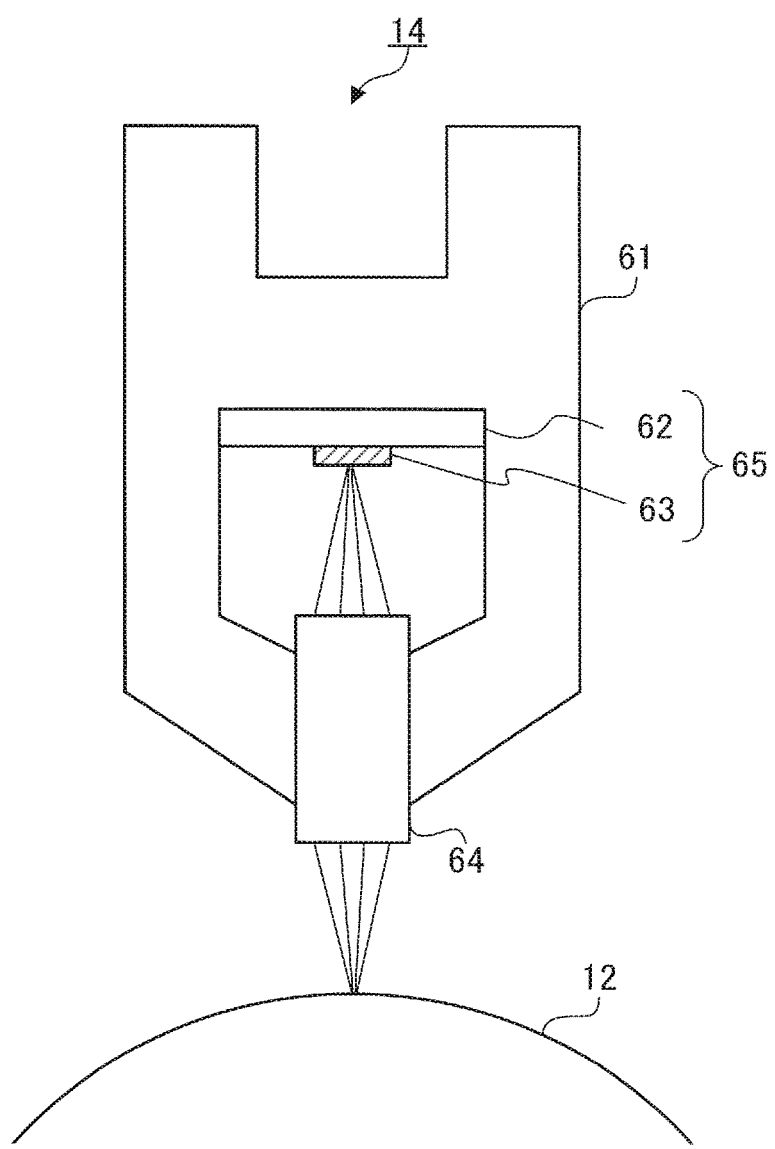
FIG. 2 is a cross-sectional view showing an example of the structure of a print head.

FIG. 2 is a cross-sectional view showing an example of the structure of the print head 14. The print head 14 as an example of the exposing portion is provided with: a housing 61; a light emitter 65 as an example of the light emitting portion provided with a light source portion 63 provided with plural light emitting devices (in the first exemplary embodiment, light emitting diodes LED as an example of the light emitting devices) that expose the photoreceptor drum 12; and a rod lens array 64 as an example of the optical portion that images the light emitted from the light source portion 63 on the surface of the photoreceptor drum 12.

The light emitter 65 is provided with a circuit board 62 mounted with the above-described light source portion 63, a signal generating circuit 110 that drives the light source portion 63 (see FIG. 3 described later) and the like.

The housing 61 is made of, for example, a metal, supports the circuit board 62 and the rod lens array 64, and is set so that the light emitting surfaces of the light emitting devices of the light source portion 63 are the focal plane of the rod lens array 64. Moreover, the rod lens array 64 is disposed in the axial direction of the photoreceptor drum 12 (the main scanning direction and the X direction in FIG. 3 and (b) of FIG. 4 described later).

(Light Emitter 65)

Figure 3:
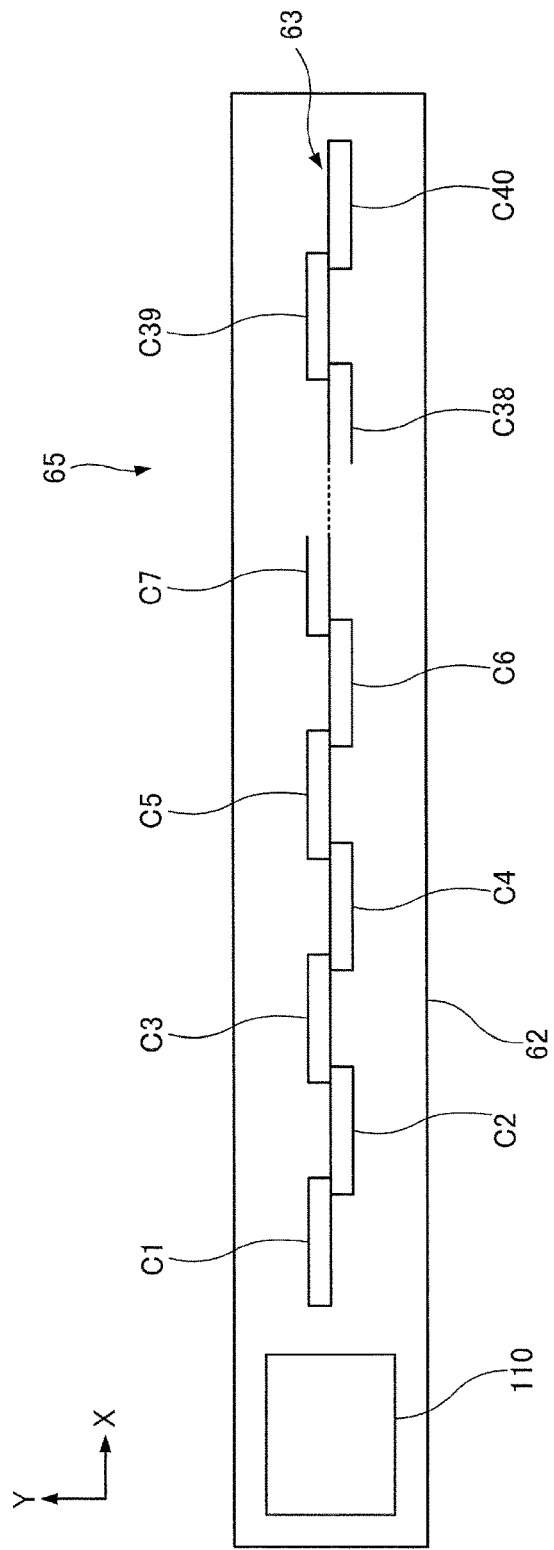
FIG. 3 is a top view of an example of a light emitter.

FIG. 3 is a top view of an example of the light emitter 65. In the light emitter 65 shown as an example in FIG. 3, the light source portion 63 is structured by disposing, in a zig-zag manner, 40 light emitting chips C1-C40 (referred to as the light emitting chip C when not distinguished from one another) as an example of the light emitting component on the circuit board 62 in two lines in the X direction which is the main scanning direction. The structures of the light emitting chips C1-C40 may be the same.

In the present description, "-" represents plural constituents distinguished from one another by numbers and indicates that the constituents with the numbers shown before and behind "-" and the numbers therebetween are included. For example, the light emitting chips C1-C40 include from the light emitting chip C1 to the light emitting chip C40 in numerical order.

While in the first exemplary embodiment, a total of 40 is used as the number of light emitting chips C, the number is not limited thereto.

The light emitter 65 is mounted with the signal generating circuit 110 that drives the light source portion 63. The signal generating circuit 110 is formed of, for example, an integrated circuit (IC). The light emitter 65 may be not mounted with the signal generating circuit 110. At this time, the signal generating circuit 110 is provided outside the light emitter 65, and supplies through a cable or the like signals such as a control signal that controls the light emitting chips C. Here, description will be given on the assumption that the light emitter 65 is provided with the signal generating circuit 110. Details of the arrangement of the light emitting chips C will be described later.

Figure 4:
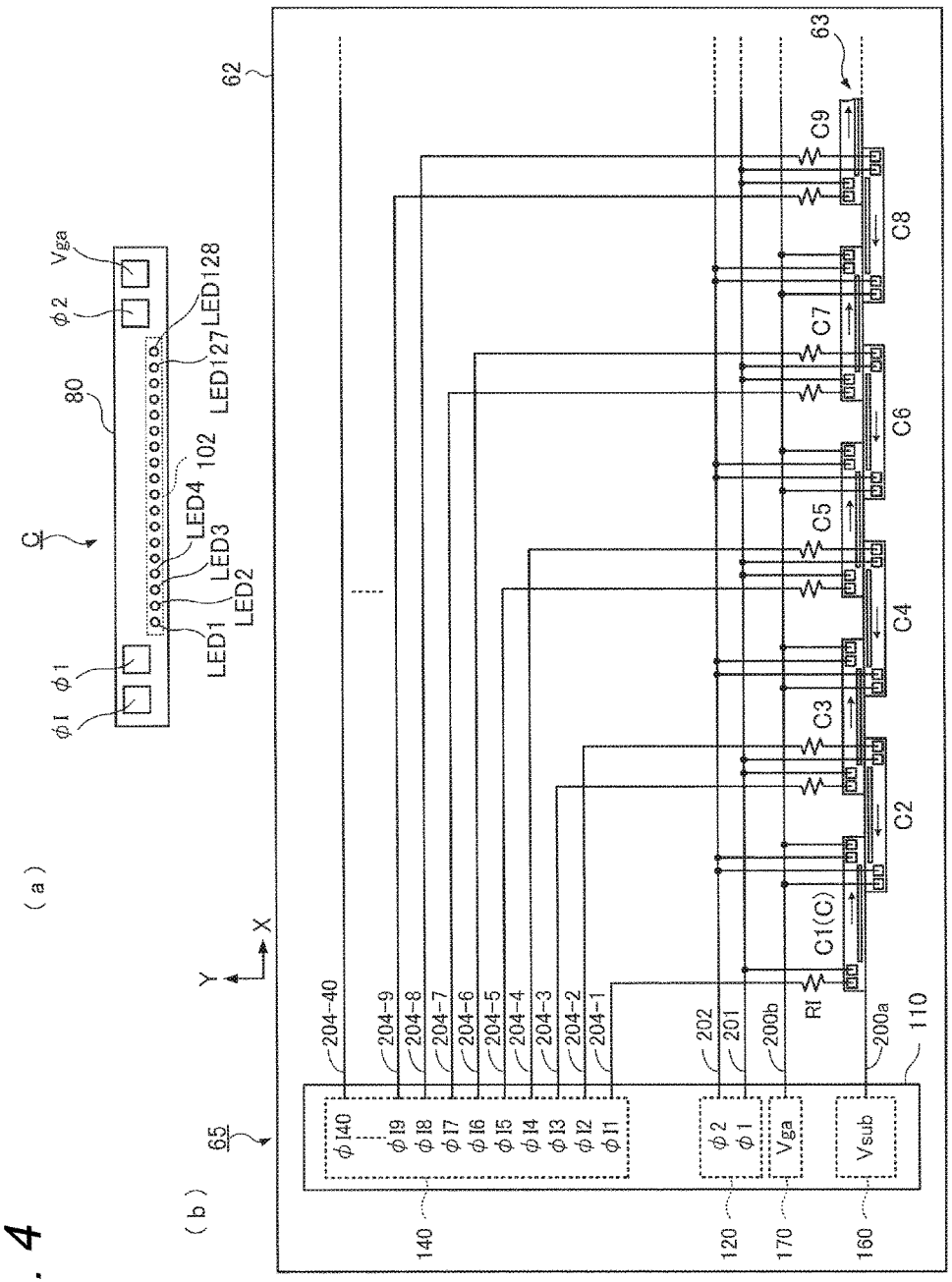
FIG. 4 is views showing an example of the structure of light emitting chips, and the structure of a signal generating circuit and the structure of the wirings (lines) on a circuit board in a light emitter.

FIG. 4 is views showing an example of the structure of the light emitting chips C, and the structure of the signal generating circuit 110 and the structure of the wirings (lines) on the circuit board 62 in the light emitter 65. (a) of FIG. 4 shows the structure of the light emitting chip C, and (b) of FIG. 4 shows the structure of the signal generating circuit 110 and the structure of the wirings (lines) on the circuit board 62 in the light emitter 65. In (b) of FIG. 4, of the light emitting chips C1-C40, the part of the light emitting chips C1-C9 is shown.

First, the structure of the light emitting chip C shown in (a) of FIG. 4 will be described.

The light emitting chip C is provided with a light emitting portion 102 formed so as to include plural light emitting devices (in the first exemplary embodiment, light emitting diodes LED1-LED128 [referred to as the light emitting diode LED when not distinguished from one another]) provided in a row on the side close to one long side along the long side on the surface of a substrate 80 the surface shape of which is rectangular. Further, the light emitting chip C is provided with terminals (a φ1 terminal, a φ2 terminal, a Vga terminal, a φI terminal) which are plural bonding pads for capturing various control signals and the like in both end portions in the length direction on the surface of the substrate 80. These terminals are provided in the order of the φI terminal and the φ1 terminal from one end portion of the substrate 80 and provided in the order of the Vga terminal and the φ2 terminal from the other end portion of the substrate 80. The light emitting portion 102 is provided between the φ2 terminal and the φ2 terminal. Further, on the reverse surface of the substrate 80, a reverse side electrode 92 (see FIG. 6 described later) is provided as a Vsub terminal.

Here, "in a row" may indicate not only a case where plural light emitting devices are arranged on a straight line as shown in (a) of FIG. 4 but also a condition where the light emitting devices of plural light emitting devices are disposed with shift amounts different from one another with respect to a direction orthogonal to the direction of the row. For example, when the light emitting surfaces of the light emitting devices (areas 311 of the light emitting diodes LED in FIG. 6 described later) are pixels, the light emitting devices may be disposed with shift amounts of several pixels or several tens of pixels in the direction orthogonal to the direction of the row. Moreover, they may be disposed in a zig-zag manner alternately between the adjoining light emitting devices or every two or more light emitting devices.

Next, with (b) of FIG. 4, the structure of the signal generating circuit 110 and the structure of the wirings (lines) on the circuit board 62 in the light emitter 65 will be described.

As described above, on the circuit board 62 of the light emitter 65, the signal generating circuit 110 and the light emitting chips C1-C40 are mounted, and the wirings (lines) connecting the signal generating circuit 110 and the light emitting chips C1-C40 are provided.

First, the structure of the signal generating circuit 110 will be described.

To the signal generating circuit 110, image data having undergone image processing and various control signals are inputted from the image output controller 30 and the image processor 40 (see FIG. 1). The signal generating circuit 110 performs image data rearrangement, light amount correction and the like based on these image data and various control signals.

The signal generating circuit 110 is provided with a transfer signal generating portion 120 that transmits a first transfer signal φ1 and a second transfer signal φ2 to the light emitting chips C1-C40 based on various control signals.

Moreover, the signal generating circuit 110 is provided with a lighting signal generating portion 140 that transmits lighting signals φI1-φI40 (referred to as the lighting signal φI when not distinguished from each other) to the light emitting chips C1-C40 based on various control signal, respectively.

Further, the signal generating circuit 110 is provided with a reference potential supplying portion 160 that supplies a reference potential Vsub serving as the reference of the potential to the light emitting chips C1-C40 and a power source potential supplying portion 170 that supplies a power source potential Vga for the driving of the light emitting chips C1-C40.

Next, the arrangement of the light emitting chips C1-C40 will be described.

The odd-numbered light emitting chips C1, C3, C5, . . . are arranged in a row at intervals in the direction of the length of the substrate 80. The even-numbered light emitting chips C2, C4, C6, . . . are also arranged in a row at intervals in the direction of the length of the substrate 80. The odd-numbered light emitting chips C1, C3, C5, . . . and the even-numbered light emitting chips C2, C4, C6, . . . are arranged in a zig-zag manner in a state of being rotated by 180 degrees with respect to each other so that the long sides on the side of the light emitting portions 102 provided on the light emitting chips C face each other. The positions are set so that the light emitting devices are arranged at predetermined intervals in the main scanning direction (X direction) also between the light emitting chips C. At the light emitting chips C1-C40 of (b) of FIG. 4, the directions of the arrangements (in the order of the numbers of the light emitting diodes LED1-LED128 in the first exemplary embodiment) of the light emitting devices of the light emitting portions 102 shown in (a) of FIG. 4 are indicated by arrows.

The wirings (lines) connecting the signal generating circuit 110 and the light emitting chips C1-C40 will be described.

The circuit board 62 is provided with a power source line 200a connected to the reverse side electrodes 92 which are the Vsub terminals provided on the reverse surfaces of the substrates 80 of the light emitting chips C (see FIG. 6 described later), and supplying the reference potential Vsub.

And the circuit board 62 is provided with a power source line 200b connected to the Vga terminals provided on the light emitting chips C and supplying the power source potential Vga for driving.

The circuit board 62 is provided with a first transfer signal line 201 for transmitting the first transfer signal φ1 to the φ1 terminals of the light emitting chips C1-C40 from the transfer signal generating portion 120 of the signal generating circuit 110 and a second transfer signal line 202 for transmitting the second transfer signal φ2 to the φ2 terminals of the light emitting chips C1-C40. The first transfer signal φ1 and the second transfer signal φ2 are transmitted to the light emitting chips C1-C40 in common (in parallel).

Moreover, the circuit board 62 is providedwith lighting signal lines 204-1-204-40 (referred to as the lighting signal line 204 when not distinguished from one another) that transmit the lighting signals φI1-φI40 through current limiting resistors RI to the φI terminals of the light emitting chips C1-C40 from the lighting signal generating portion 140 of the signal generating circuit 110, respectively.

As described above, the reference potential Vsub and the power source potential Vga are supplied to all the light emitting chips C1-C40 on the circuit board 62 in common. The first transfer signal φ1 and the second transfer signal φ2 are also transmitted to the light emitting chips C1-C40 in common (in parallel). On the other hand, the lighting signals φI1-φI40 are individually transmitted to the light emitting chips C1-C40, respectively.

(Light Emitting Chip C)

Figure 5:
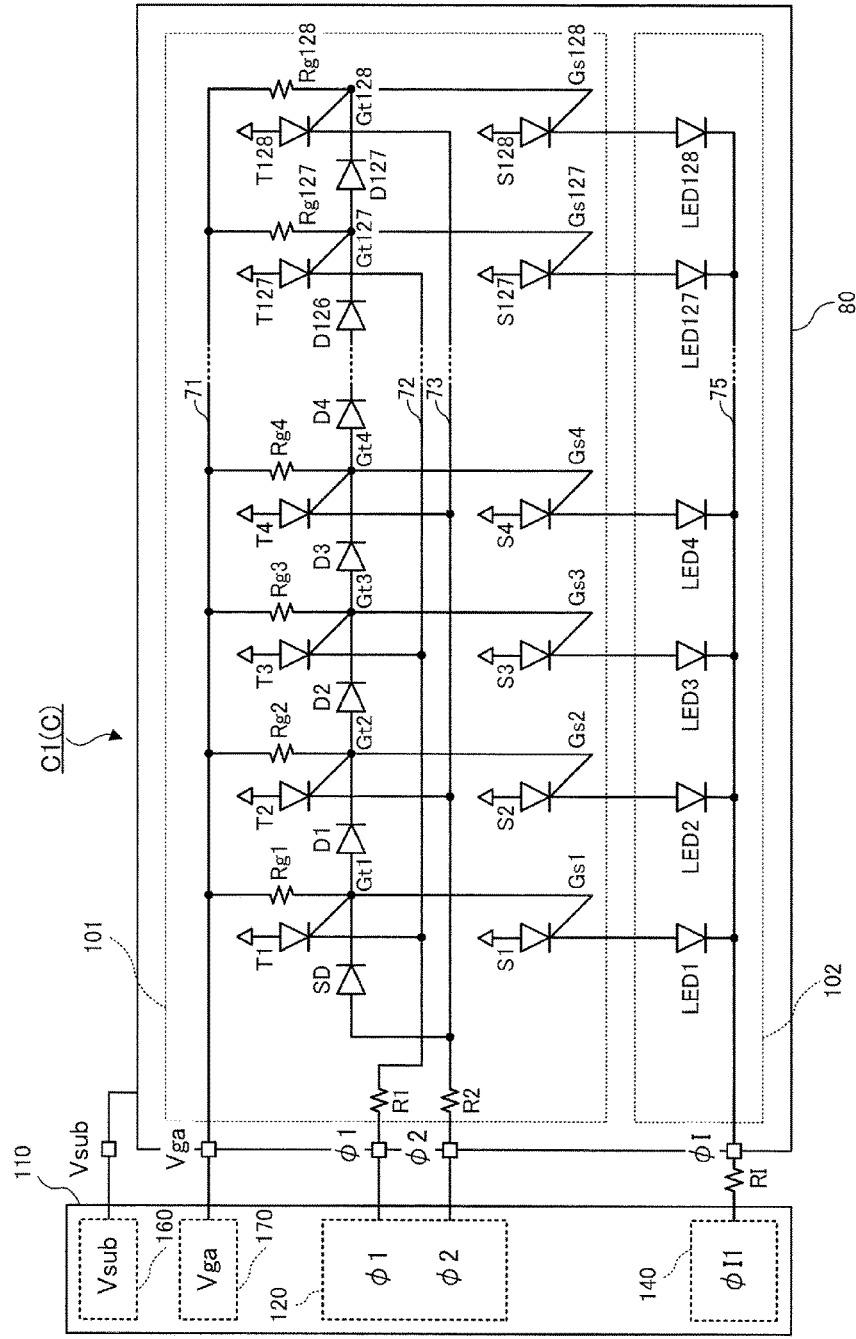
FIG. 5 is an equivalent circuit diagram explaining the circuit configuration of the light emitting chip mounted with a self-scanning type light emitting device array (SLED) according to the first exemplary embodiment.

FIG. 5 is an equivalent circuit diagram explaining the circuit configuration of the light emitting chip C mounted with a self-scanning type light emitting device array (SLED) according to the first exemplary embodiment. The devices described below are disposed based on a layout on the light emitting chip C (see FIG. 6 described later) except for the terminals φ1 terminal, the φ2 terminal, the Vga terminal, the φI terminal). Although the positions of the terminals (the φ1 terminal, the φ2 terminal, the Vga terminal, the φI terminal) are different from those of (a) of FIG. 4, they are shown on the left end in the figure for the explanation of the relation of connection with the signal generating circuit 110. The Vsub terminal provided on the reverse surface of the substrate 80 is shown being drawn to the outside of the substrate 80.

Here, the light emitting chip C will be described with the light emitting chip C1 as an example in the relation with the signal generating circuit 110. Accordingly, in FIG. 5, the light emitting chip C will be referred to as the light emitting chip C1(C). The structures of the other light emitting chips C2-C40 are the same as that of the light emitting chip C1.

The light emitting chip C1(C) is provided with the light emitting portion 102 formed of the light emitting diodes LED1-LED128 (see (a) of FIG. 4).

The light emitting chip C1(C) is provided with setting thyristors S1-S128 (referred to as the setting thyristor S when not distinguished from one another). Regarding the light emitting diodes LED1-LED128 and the setting thyristors S1-S128, the light emitting diodes LED and the setting thyristors S of the same numbers are connected in series.

As shown in (b) of FIG. 6 described later, the light emitting diodes LED are laminated on the setting thyristors S arranged in a row on the substrate 80. Consequently, the light emitting diodes LED1-LED128 are also arranged in a row.

The light emitting chip C1(C) is provided with transfer thyristors T1-T128 (referred to as the transfer thyristor T when not distinguished from one another) arranged in a row similarly to the light emitting diodes LED1-LED128 and the setting thyristors S1-S128.

While description will be given by using the transfer thyristor T as an example of the transfer device here, a different circuit device may be used as long as it is a device that successively comes into ON state; for example, a circuit device formed of shift transistors or a combination of plural transistors may be used.

On the light emitting chip C1(C), each two, in numeric order, of the transfer thyristors T1-T128 are paired and coupling diodes D1-D127 (referred to as the coupling diode D when not distinguished from one another) are provided between each of the pairs, respectively.

Further, the light emitting chip C1(C) is provided with power source line resistors Rg1-Rg128 (referred to as the power source line resistor Rg when not distinguished from one another).

Moreover, the light emitting chip C1(C) is provided with one start diode SD. And the light emitting chip C1(C) is provided with current limiting resistors R1 and R2 provided to prevent excessive current from flowing on a later-described first transfer signal line 72 where the first transfer signal φ1 is transmitted and second transfer signal line 73 where the second transfer signal φ2 is transmitted.

Here, a transfer portion 101 is formed of the setting thyristors S1-S128, the transfer thyristors T1-T128, the power source line resistors Rg1-Rg128, the coupling diodes D1-D127, the start diode SD and the current limiting resistors R1 and R2.

The light emitting diodes LED1-LED128 of the light emitting portion 102, and the setting thyristors S1-S128 and the transfer thyristors T1-T128 of the transfer portion 101 are arranged in numerical order from the left in FIG. 5. Further, the coupling diodes D1-D127 and the power source line resistors Rg1-Rg128 are also arranged in numerical order from the left side of the figure.

And the transfer portion 101 and the light emitting portion 102 are arranged in this order from above in FIG. 5.

In the first exemplary embodiment, the numbers of light emitting diodes LED in the light emitting portion 102, setting thyristors S, transfer thyristors T and power source line resistors Rg in the transfer portion 101 are each 128. The number of coupling diodes D is 127 which is smaller by one than the number of transfer thyristors T.

The numbers of light emitting diodes LED and the like are not limited the above ones but are only necessarily predetermined numbers. The number of transfer thyristors T may be larger than that of the light emitting diodes LED.

The above-described light emitting diodes LED are two-terminal semiconductor devices provided with an anode terminal (anode) and a cathode terminal (cathode), the thyristors (the setting thyristors S, the transfer thyristors T) are semiconductor devices having three terminals of an anode terminal (anode), a gate terminal (gate) and a cathode terminal (cathode), and the coupling diode D1 and the start diode SD are two-terminal semiconductor devices provided with an anode terminal (anode) and a cathode terminal (cathode).

As described later, there are cases where the light emitting diodes LED, the thyristors (the setting thyristors S, the transfer thyristors T), the coupling diode D1 and the start diode SD are not always provided with an anode terminal, a gate terminal and a cathode terminal formed as electrodes. Therefore, in the following, the terminals will sometimes be abbreviated and referred to as the terms in ( ).

Next, the electric connection of the devices on the light emitting chip C1(C) will be described.

The anodes of the transfer thyristors T and the setting thyristors S are each connected to the substrate 80 of the light emitting chips C1(C) (anode common).

Figure 6:
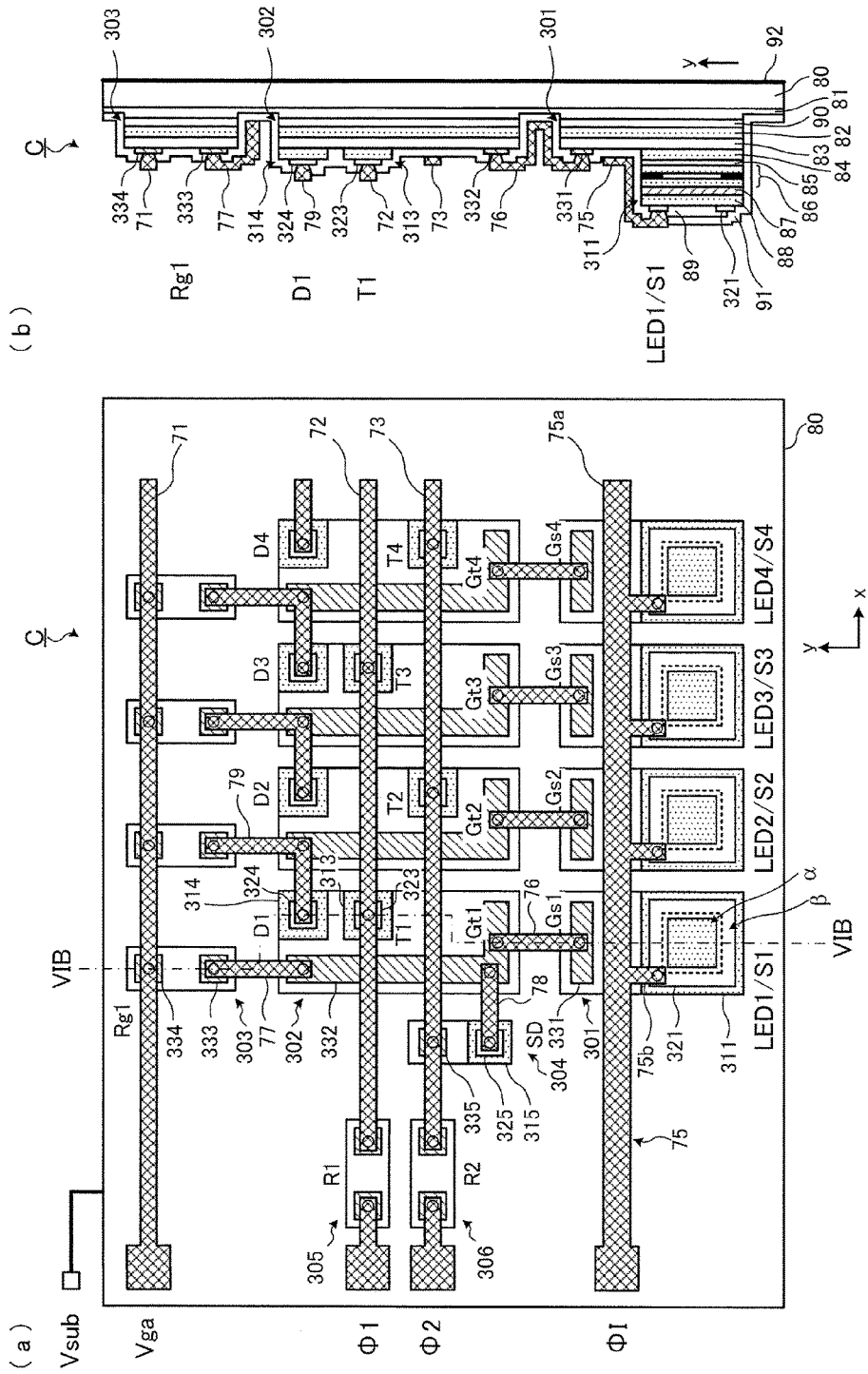
FIG. 6 is an example of a planar layout view and a cross-sectional view of the light emitting chip according to the first exemplary embodiment. (a) is a planar layout view of the light emitting chip, and (b) is a cross-sectional view along the line VIB-VIB of (a)

These anodes are connected to the power source line 200a (see (b) of FIG. 4) through the reverse side electrode 92 which is the Vsub terminal provided on the reverse surface of the substrate 80 (see (b) of FIG. 6). This power source line 200a is supplied with the reference potential Vsub from the reference potential supplying portion 160.

This connection is a structure when the p-type substrate 80 is used; when an n-type substrate is used, the polarity is opposite, and when an intrinsic (i) type (semi-insulating or insulating) substrate without any impurity added thereto is used, a terminal to be connected to the reference potential Vsub is provided on the side where the transfer portion 101 and the light emitting portion 102 of the substrate is provided.

Along the arrangement of the transfer thyristors T, the cathodes of the odd-numbered transfer thyristors T1, T3, . . . are connected to the first transfer signal line 72. The first transfer signal line 72 is connected to the φ1 terminal through the current limiting resistor R1. To this φI terminal, the first transfer signal line 201 (see (b) of FIG. 4) is connected, and the first transfer signal φ1 is transmitted from the transfer signal generating portion 120.

On the other hand, along the arrangement of the transfer thyristors T, the cathodes of the even-numbered transfer thyristors T2, T4, are connected to the second transfer signal line 73. The second transfer signal line 73 is connected to the φ2 terminal through the current limiting resistor R2. To this φ2 terminal, the second transfer signal line 202 (see (b) of FIG. 4) is connected, and the second transfer signal φ2 is transmitted from the transfer signal generating portion 120.

The cathodes of the light emitting diodes LED1-LED128 are connected to a lighting signal line 75. The lighting signal line 75 is connected to the φI terminal. On the light emitting chip C1, the φI terminal is connected to the lighting signal line 204-1 through the current limiting resistor RI provided outside the light emitting chip C1(C), and the lighting signal φI1 is transmitted from the lighting signal generating portion 140 (see (b) of FIG. 4). The lighting signal φI1 supplies the light emitting diodes LED1-LED128 with current for lighting. To the φI terminals of the other light emitting chips C2-C40, the lighting signal lines 204-2-204-40 are connected through the current limiting resistors RI, respectively, and the lighting signals φI2-φI40 are transmitted from the lighting signal generating portion 140 (see (b) of FIG. 4).

Gates Gt1-Gt128 (referred to as the gate Gt when not distinguished from one another) of the transfer thyristors T1-T128 are connected one-to-one to gates Gs1-Gs128 (referred to as the gate Gs when not distinguished from one another) of the setting thyristors S1-S128 of the same numbers. Therefore, the gates Gt1-Gt128 and the gates Gs1-Gs128 are such that the gates of the same numbers are of the same potentials electrically. Therefore, that the potentials are the same is indicated, for example, by a designation gate Gt1 (gate Gs1).

The coupling diodes D1-D127 are connected between each of the gates Gt which are pairs of each of two of the gates Gt1-Gt128 of the transfer thyristors T1-T128 in numerical order. That is, the coupling diodes D1-D127 are connected in series so as to be sandwiched between the gates Gt1-Gt128, respectively. Regarding the direction of the coupling diode D1, it is connected in a direction where current flows from the gate Gt1 toward the gate Gt2. The same applies to the other coupling diodes D2-D127.

The gates Gt (gates Gs) of the transfer thyristors T are connected to a power source line 71 through the power source line resistors Rg provided so as to correspond to the transfer thyristors T, respectively. The power source line 71 is connected to the Vga terminal. To the Vga terminal, the power source line 200b (see (b) of FIG. 4) is connected, and the power source potential Vga is supplied from the power source potential supplying portion 170.

The gate Gt1 of the transfer thyristor T1 is connected to the cathode terminal of the start diode SD. On the other hand, the anode of the start diode SD is connected to the second transfer signal line 73.

FIG. 6 is an example of a planar layout view and a cross-sectional view of the light emitting chip C according to the first exemplary embodiment. (a) of FIG. 6 is a planar layout view of the light emitting chip C, and (b) of FIG. 6 is a cross-sectional view along the line VIB-VIB of (a) of FIG. 6. Here, since the connection relation between the light emitting chip C and the signal generating circuit 110 is not shown, it is unnecessary to use the light emitting chip C1 as an example. Therefore, a designation light emitting chip C is used.

In (a) of FIG. 6, a part focusing on the light emitting diodes LED1-LED4, the setting thyristors S1-S4 and the transfer thyristors T1-T4 are shown. The positions of the terminals (the φ1 terminal, the φ2 terminal, the Vga terminal, the φI terminal) are, although different from those of (a) of FIG. 4, shown on the left end portion in the figure for convenience of explanation. The Vsub terminal (the reverse side electrode 92) provided on the reverse surface of the substrate 80 is shown being drawn to the outside of the substrate 80. Assuming that the terminals are provided so as to correspond to those of (a) of FIG. 4, the φ2 terminal, the φ1 terminal and the current limiting resistor R2 are provided on the right end portion of the substrate 80. The start diode SD may be provided on the right end portion of the substrate 80.

In (b) of FIG. 6 which is a cross-sectional view along the line VIB-VIB of (a) of FIG. 6, the light emitting diode LED1/the setting thyristor S1, the transfer thyristor T1, the coupling diode D1 and the power source line resistor Rg1 are shown from below in the figure. The light emitting diode LED1 and the setting thyristor S1 are laminated.

In the drawings of (a) and (b) of FIG. 6, principal devices and terminals are indicated by names.

First, the cross-sectional structure of the light emitting chip C will be described with (b) of FIG. 6.

On the p-type substrate 80 (substrate 80), a p-type anode layer 81 (p anode layer 81), a voltage reducing layer 90, an n-type gate layer 82 (n gate layer 82), a p-type gate layer 83 (p gate layer 83) and an n-type cathode layer 84 (n cathode layer 84) are provided sequentially. In the following, the designations in ( ) are used. The same applies to other cases.

On the n cathode layer 84, a tunnel junction (tunnel diode) layer 85 is provided.

Further, on the tunnel junction layer 85, a p-type anode layer 86 (p anode layer 86), a light emitting layer 87, an n-type cathode layer 88 (n cathode layer 88) are provided.

And on the light emitting diode LED1, a light exit port protecting layer 89 is provided that is made of an insulating material having the property of transmitting the light emitted by the light emitting diode LED.

The voltage reducing layer 90 may be made a p anode layer together with the p anode layer 81 by making it be of a p type with an impurity concentration similar to that of the p anode layer 81. Moreover, the voltage reducing layer 90 may be made an n gate layer together with the n gate layer 82 by making it be of an n type with an impurity concentration similar to that of the n gate layer 82.

Here, the p anode layer 81 is an example of a first semiconductor layer, the n gate layer 82 is an example of a second semiconductor layer, the p gate layer 83 is an example of a third semiconductor layer, and the n cathode layer 84 is an example of a fourth semiconductor layer. When the voltage reducing layer 90 is included in the p anode layer, the voltage reducing layer 90 is included in the first semiconductor layer. Moreover, when the voltage reducing layer 90 is included in the n gate layer, the voltage reducing layer 90 is included in the second semiconductor layer. The same applies hereafter. Moreover, the voltage reducing layer 90 may be an i layer.

On the light emitting chip C, as shown in (b) of FIG. 6, a protecting layer 91 is provided that is made of a light transmitting insulating material provided so as to cover the surface and sides of these islands. These islands and wirings such as the power source line 71, the first transfer signal line 72, the second transfer signal line 73 and the lighting signal line 75 are connected through through holes (indicated by o in (a) of FIG. 6) provided on the protecting layer 91. In the following description, description of the protecting layer 91 and the through holes is omitted.

Moreover, as shown in (b) of FIG. 6, the reverse side electrode 92 serving as the Vsub terminal is provided on the reverse surface of the substrate 80.

The p anode layer 81, the voltage reducing layer 90, the n gate layer 82, the p gate layer 83, the n cathode layer 84, the tunnel junction layer 85, the p anode layer 86, the light emitting layer 87 and the n cathode layer 88 are all semiconductor layers, and laminated sequentially by epitaxial growth. And in order that plural islands (islands 301, 302, 303, . . . described later) separated from one another result, the semiconductor layer between the islands is removed by etching (mesa etching). The p anode layer 81 may be separated or may be not separated. In (b) of FIG. 6, the p anode layer 81 is partly separated in the direction of the thickness. Moreover, the p anode layer 81 may serve also as the substrate 80.

By using the p anode layer 81, the voltage reducing layer 90, the n gate layer 82, the p gate layer 83 and the n cathode layer 84, the setting thyristor S, the transfer thyristor T, the coupling diode D, the power source line resistor Rg and the like (in (b) of FIG. 6, the setting thyristor S1, the transfer thyristor T1, the coupling diode D1 and the power source line resistor Rg1) are formed.

Here, the designations of the p anode layer 81, the voltage reducing layer 90, the n gate layer 82, the p gate layer 83 and the n cathode layer 84 are associated with the functions (workings) when the setting thyristor S and the transfer thyristor T are formed. That is, the p anode layer 81 acts as an anode, the n gate layer 82 and the p gate layer 83 act as gates, and the n cathode layer 84 acts as a cathode. The voltage reducing layer 90 acts as part of the p anode layer 81 or part of the n gate layer 82 as described later. When the coupling diode D and the power source line resistor Rg are formed, they function (act) differently as described later.

By the p anode layer 86, the light emitting layer 87 and the n cathode layer 88, the light emitting diode LED (in (b) of FIG. 6, the light emitting diode LED1) is formed.

The same applies to the designations of the p anode layer 86 and then cathode layer 88, and they are associated with the functions (workings) when the light emitting diode LED is formed. That is, the p anode layer 86 acts as an anode, and the n cathode layer 88 acts as a cathode.

As described below, the plural islands include islands not provided with some or any of the p anode layer 81, the voltage reducing layer 90, the n gate layer 82, the p gate layer 83, the n cathode layer 84 and the tunnel junction layer 85 and some layers of plural layers of the p anode layer 86, the light emitting layer 87 and the n cathode layer 88. For example, the island 302 is not provided with the tunnel junction layer 85, the p anode layer 86, the light emitting layer 87 or the n cathode layer 88.

Moreover, the plural islands include islands not provided with part of a layer. For example, while the island 302 is provided with the p anode layer 81, the voltage reducing layer 90, the n gate layer 82, the p gate layer 83 and the n cathode layer 84, it is provided with only part of the n cathode layer 84.

Next, the planar layout of the light emitting chip C will be described with (a) of FIG. 6.

On the island 301, the setting thyristor S1 and the light emitting diode LED1 are provided. On the island 302, the transfer thyristor T1 and the coupling diode D1 are provided. On the island 303, the power source line resistor Rg1 is provided. On the island 304, the start diode SD is provided. On the island 305, the current limiting resistor R1 is provided, and on the island 306, the current limiting resistor R2 is provided.

On the light emitting chip C, plural islands similar to the islands 301, 302 and 303 are formed in parallel. On these islands, the setting thyristors S2, S3, S4, . . . , the light emitting diodes LED2, LED3, LED4, . . . , the transfer thyristors T2, T3, T4, . . . , the coupling diodes D2, D3, D4, . . . and the like are provided similarly to the islands 301, 302 and 303.

Here, the island 301—the island 306 will be described in detail with (a) and (b) of FIG. 6.

As shown in (a) of FIG. 6, on the island 301, the setting thyristor S1 and the light emitting diode LED1 are provided.

The setting thyristor S1 is formed of the p anode layer 81, the voltage reducing layer 90, the n gate layer 82, the p gate layer 83 and the n cathode layer 84. And a p-type ohmic electrode 331 (p ohmic electrode 331) provided on the p gate layer 83 exposed by removing the n cathode layer 88, the light emitting layer 87, the p anode layer 86, the tunnel junction layer 85 and the n cathode layer 84 are made the electrode of the gate Gs1 (sometimes referred to as the gate terminal Gs1).

On the other hand, the light emitting diode LED1 is formed of the p anode layer 86, the light emitting layer 87 and the n cathode layer 88. The light emitting diode LED1 is laminated on the n cathode layer 84 of the setting thyristor S1 through the tunnel junction layer 85. And an n-type ohmic electrode 321 (n ohmic electrode 321) provided on the n cathode layer 88 (the area 311) is made a cathode electrode.

The p anode layer 86 includes a current constricting layer 86b (see FIG. 7 described later). The current constricting layer 86b is provided in order to limit the current flowing through the light emitting diode LED to the central portion of the light emitting diode LED. That is, there are many defects due to mesa etching in the peripheral portions of the light emitting diode LED. For this reason, non-emission recombination readily occurs. Accordingly, the current constricting layer 86b is provided so that the central portion of the light emitting diode LED is a current passing portion α where current easily flows and the peripheral portion is a current blocking portion β where current hardly flows. As shown at the light emitting diode LED1 in (a) of FIG. 6, the inside of the broken line is the current passing portion α and the outside of the broken line is the current blocking portion β.

In order to extract light from the central portion of the light emitting diode LED1, the n ohmic electrode 321 is provided in the peripheral portion of the light emitting diode LED1 so that the central portion is an opening.

The current constricting layer 86b will be described later.

Since the provision of the current constricting layer 86b suppresses the power consumed by the non-emission recombination, consumed power reduction and light extraction efficiency improve. The light extraction efficiency is a light amount that can be extracted per power.

On the island 302, the transfer thyristor T1 and the coupling diode D1 are provided.

The transfer thyristor T1 is formed of the p anode layer 81, the voltage reducing layer 90, the n gate layer 82, the p gate layer 83 and n cathode layer 84. That is, an n ohmic electrode 323 provided on the n cathode layer 84 (an area 313) exposed by removing the n cathode layer 88, the light emitting layer 87, the p anode layer 86 and the tunnel junction layer 85 is made a cathode terminal. The n ohmic electrode 323 may be provided on an $n^{++}$ layer 85a of the tunnel junction layer 85 without the $n^{++}$ layer 85a of the tunnel junction layer 85 being removed. And a p ohmic electrode 332 provided on the p gate layer 83 exposed by removing the n cathode layer 84 is made the terminal of the gate Gt1 (sometimes referred to as the gate terminal Gt1).

Likewise, the coupling diode D1 provided on the island 302 is formed of the p gate layer 83 and the n cathode layer 84. That is, an n ohmic electrode 324 provided on the n cathode layer 84 (an area 314) exposed by removing the n cathode layer 88, the light emitting layer 87, the p anode layer 86 and the tunnel junction layer 85 is made a cathode electrode. The n ohmic electrode 324 may be provided on the $n^{++}$ layer 85$a$ of the tunnel junction layer 85 without the $n^{++}$ layer 85$a$ of the tunnel junction layer 85 being removed. And the p ohmic electrode 332 provided on the p gate layer 83 exposed by removing the n cathode layer 84 is made an anode terminal. Here, the anode terminal of the coupling diode D1 is the same as the gate Gt1 (gate terminal Gt1).

The power source line resistor Rg1 provided on the island 303 is formed of the p gate layer 83. Here, the p gate layer 83 between a p ohmic electrode 333 and a p ohmic electrode 334 provided on the p gate layer 83 exposed by removing the n cathode layer 88, the light emitting layer 87, the p anode layer 86, the tunnel junction layer 85 and the n cathode layer 84 is provided as a resistor.

The start diode SD provided on the island 304 is formed of the p gate layer 83 and the n cathode layer 84. That is, an n ohmic electrode 325 provided on the n cathode layer 84 (an area 315) exposed by removing the n cathode layer 88, the light emitting layer 87, the p anode layer 86 and the tunnel junction layer 85 is made a cathode terminal. The n ohmic electrode 325 may be provided on the $n^{++}$ layer 85$a$ of the tunnel junction layer 85 without the $n^{++}$ layer 85$a$ of the tunnel junction layer 85 being removed. And a p ohmic electrode 335 provided on the p gate layer 83 exposed by removing the n cathode layer 84 is made an anode terminal.

The current limiting resistor R1 provided on the island 305 and the current limiting resistor R2 provided on the island 306 are provided similarly to the power source line resistor Rg1 provided on the island 303, and each uses the p gate layer 83 between two p ohmic electrodes (no designations) as a resistor.

In (a) of FIG. 6, the connection relation between the devices will be described.

The lighting signal line 75 is provided with a trunk portion 75$a$ and plural branch portions 75$b$. The trunk portion 75$a$ is provided so as to extend in the direction of the row of the light emitting diodes LED. The branch portion 75$b$ branches off from the trunk portion 75$a$ to be connected to the n ohmic electrode 321 as the cathode terminal of the light emitting diode LED1 provided on the island 301. The same applies to the cathode terminals of the other light emitting diodes LED.

The lighting signal line 75 is connected to the φI terminal provided on the side of the light emitting diode LED1.

The first transfer signal line 72 is connected to the n ohmic electrode 323 which is the cathode terminal of the transfer thyristor T1 provided on the island 302. To the first transfer signal line 72, the cathode terminals of the other odd-numbered transfer thyristors T provided on islands similar to the island 302 are connected. The first transfer signal line 72 is connected to the φ1 terminal through the current limiting resistor R1 provided on the island 305.

On the other hand, the second transfer signal line 73 is connected to n ohmic electrodes (no designations) which are the cathode terminals of the even-numbered transfer thyristors T provided on islands with no designations. The second transfer signal line 73 is connected to the φ2 terminal through the current limiting resistor R2 provided on the island 306.

The power source line 71 is connected to the p ohmic electrode 334 which is one terminal of the power source line resistor Rg1 provided on the island 303. The one terminals of the other power source line resistors Rg are also connected to the power source line 71. The power source line 71 is connected to the Vga terminal.

The p ohmic electrode 331 (the gate terminal Gs1) of the light emitting diode LED1 provided on the island 301 is connected to the p ohmic electrode 332 (the gate terminal Gt1) of the island 302 by a connection wiring 76.

The p ohmic electrode 332 (the gate terminal Gt1) is connected to the p ohmic electrode 333 (the other terminal of the power source line resistor Rg1) of the island 303 by a connection wiring 77.

The n ohmic electrode 324 (the cathode terminal of the coupling diode D1) provided on the island 302 is connected to a p-type ohmic electrode (no designation) which is the gate terminal Gt2 of the adjoining transfer thyristor T2 by a connection wiring 79.

Although description is omitted here, the same applies to the other light emitting diodes LED, setting thyristors S, transfer thyristors T, coupling diodes D and the like.

The p ohmic electrode 332 (the gate terminal Gt1) of the island 302 is connected to the n ohmic electrode 325 (the cathode terminal of the start diode SD) provided on the island 304 by a connection wiring 78. The p ohmic electrode 335 (the anode terminal of the start diode SD) is connected to the second transfer signal line 73.

The above connections and structures are structures when the p-type substrate 80 is used, and when an n-type substrate is used, the polarity is opposite. Moreover, when an i-type substrate is used, a terminal connected to the power source line 200$a$ that supplies the reference voltage Vsub is provided on the side where the transfer portion 101 and the light emitting portion 102 of the substrate are provided. The connections and structures are similar to those of either the case where the p-type substrate 80 is used or the case where an n-type substrate is used.

(Structure of Lamination of the Setting Thyristor S and the Light Emitting Diode LED)

Figure 7:
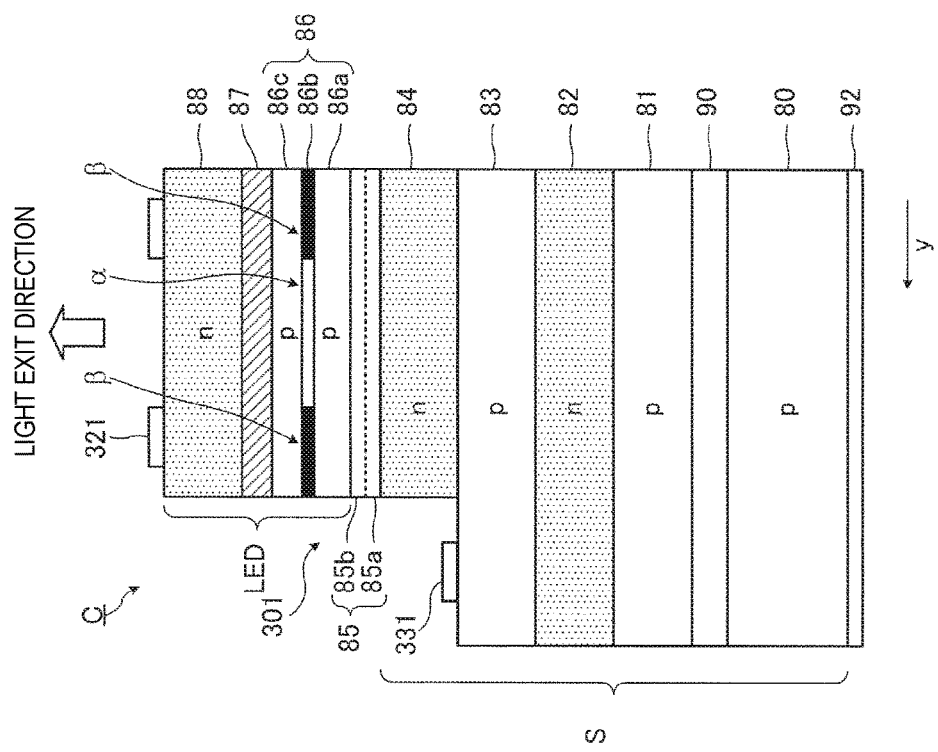
FIG. 7 is an enlarged cross-sectional view of an island where a setting thyristor and a light emitting diode are laminated.

FIG. 7 is an enlarged cross-sectional view of the island 301 where the setting thyristor S and the light emitting diode LED are laminated. The light exit port protecting layer 89 and the protecting layer 91 are omitted. The same applies hereafter.

As described above, the light emitting diode LED is laminated on the setting thyristor S through the tunnel junction layer 85. That is, the setting thyristor S and the light emitting diode LED are connected in series.

The setting thyristor S is formed of the p anode layer 81, the voltage reducing layer 90, the n gate layer 82, the p gate layer 83 and the n cathode layer 84. That is, it has a structure where the voltage reducing layer 90 is added to a four-layer structure of pnpn.

The voltage reducing layer 90 may be of the p type with an impurity concentration similar to that of the p anode layer 81 as part of the p anode layer 81 or may be of the n type with an impurity concentration similar to that of the n gate layer 82 as part of the n gate layer 82. Moreover, the voltage reducing layer 90 may be an i layer.

The tunnel junction layer 85 is formed of the $n^{++}$ layer 85$a$ to which an n-type impurity (dopant) is added (doped) at a high concentration and a $p^{++}$ layer 85$b$ to which a p-type impurity is added at a high concentration.

The light emitting diode LED is formed of the p anode layer 86, the light emitting layer 87 and the n cathode layer 88. The light emitting layer 87 has a quantum well structure where well layers and barrier layers are laminated alternately. The light emitting layer 87 may be an i layer. Moreover, the light emitting layer may have other than the quantum well structure, and may be, for example, a quantum line (quantum wire) or a quantum box (quantum dot).

The p anode layer 86 is formed of a lower side p layer 86*a*, the current constricting layer 86*b* and an upper side p layer 86*c* which are laminated. The current constricting layer 86*b* is formed of the current passing portion α and the current blocking portion β. As shown in (a) of FIG. 6, the current passing portion α is provided in the central portion of the light emitting diode LED, and the current blocking portion β, in the peripheral portion of the light emitting diode LED.

<Voltage Reducing Layer 90>

FIG. 8 is views explaining the structure of the thyristor and the characteristic of the thyristor. (a) of FIG. 8 is a cross-sectional view of the thyristor according to the first exemplary embodiment provided with the voltage reducing layer 90, (b) of FIG. 8 is a cross-sectional view of the thyristor not provided with the voltage reducing layer 90, and (c) of FIG. 8 is the thyristor characteristic. (a) and (b) of FIG. 8 show cross sections of the transfer thyristors T where no light emitting diode LED is laminated. The setting thyristors S where the light emitting diodes LED are laminated exhibit a similar characteristic.

As shown in (a) of FIG. 8, the thyristors according to the first exemplary embodiment (the transfer thyristor T, the setting thyristor S) are provided with the voltage reducing layer 90 between the p anode layer 81 and the n gate layer 82. The voltage reducing layer 90 acts as part of the p anode layer 81 if it is of a p type with an impurity concentration similar to that of the p anode layer 81, and acts as part of the n gate layer 82 if it is of an n type with an impurity concentration similar to that of the n gate layer 82. The voltage reducing layer 90 may be an i layer.

The thyristor shown in (b) of FIG. 8 is not provided with the voltage reducing layer 90.

The rising voltage Vr at the thyristor depends on the lowest energy of the bandgap (bandgap energy) at the semiconductor layer forming the thyristor. The rising voltage Vr at the thyristor is the voltage when the current in the ON state of the thyristor is extrapolated to the voltage axis.

As shown in (c) of FIG. 8, in the thyristor according to the first exemplary embodiment, the voltage reducing layer 90 is provided that is a layer being low in bandgap energy compared with the p anode layer 81, the n gate layer 82, the p gate layer 83 and the n cathode layer 84. Therefore, the rising voltage Vr of the thyristor according to the first exemplary embodiment is low compared with a rising voltage Vr' of a thyristor not provided with the voltage reducing layer 90. Further, the voltage reducing layer 90 is, as an example, a layer having a bandgap smaller than the bandgap of the light emitting layer 87. The thyristor according to the first exemplary embodiment is not used as a light emitting component but functions, in every respect, as part of the driving circuit that drives a light emitting component such as the light emitting diode LED. Therefore, the bandgap is determined irrespective of the emission wavelength of the light emitting component that actually emits light. Accordingly, the rising voltage Vr of the thyristor is reduced by providing the voltage reducing layer 90 having a bandgap smaller than the bandgap of the light emitting layer 87. Thereby, the voltage applied to the thyristor and the light emitting device is also reduced with the thyristor and the light emitting device being ON.

Figure 9:
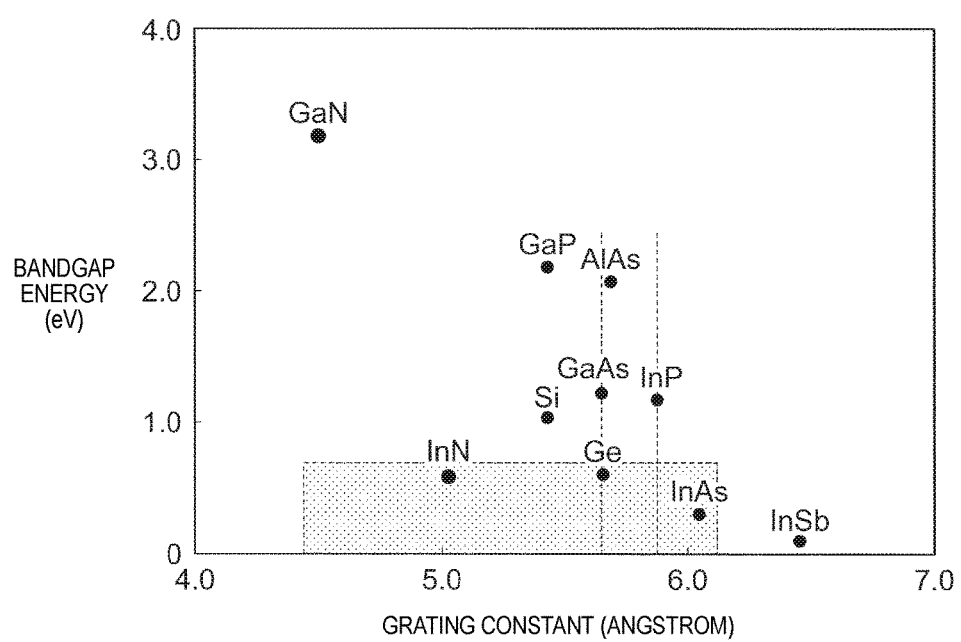
FIG. 9 is a view explaining the bandgap energies of the materials forming a semiconductor layer.

FIG. 9 is a view explaining the bandgap energies of the materials forming the semiconductor layer.

The grating constant of GaAs is approximately 5.65 angstroms. The grating constant of AlAs is approximately 5.66 angstroms. Therefore, materials close to these grating constants can epitaxially grow for the GaAs substrate. For example, AlGaAs and Ge which are compounds of GaAs and AlAs can epitaxially grow for the GaAs substrate.

Moreover, the grating constant of InP is approximately 5.87 angstroms. Materials close to this grating constant can epitaxially grow for the InP substrate.

Moreover, the grating constant of GaN which differs among growth planes is 3.19 angstroms on the a plane and is 5.17 angstroms on the c plane. Materials close to these grating constants can epitaxially grow for the GaN substrate.

The bandgap energy where the rising voltage of the thyristor is low for GaAs, Inp and GaN is the materials in the range indicated by the halftone dots shown in FIG. 9. That is, when the materials in the range indicated by the halftone dots are used as layers forming the thyristor, the rising voltage Vr of the thyristor becomes the bandgap energies of the materials in the region indicated by the halftone dots.

For example, the bandgap energy of GaAs is approximately 1.43 eV. Therefore, if the voltage reducing layer 90 is not used, the rising voltage Vr of the thyristor is approximately 1.43 V. However, by using the materials in the range indicated by the halftone dots as layers forming the thyristor or containing the materials, the rising voltage Vr of the thyristor can be made over 0V and less than 1.43 V (0 V<Vr<1.43 V).

Thereby, the power consumption when the thyristor is in ON state is reduced.

As a material in the range indicated by the halftone dots, Ge whose bandgap energy is approximately 0.67 eV for GaAs is cited. Moreover, InAs whose bandgap energy is approximately 0.36 eV for Inp is cited. Moreover, for a GaAs substrate or an InP substrate, a material being low in bandgap energy is usable in a compound of GaAs and Inp, a compound of InN and InSb, a compound of InN and InAs, and the like. In particular, a GaInNAs-based mixed compound is suitable. Al, Ga, As, P, Sb and the like may be contained therein. Moreover, for GaN, GaNP can be the voltage reducing layer 90. In addition, (1) an InN layer and an InGaN layer by metamorphic growth or the like, (2) quantum dots consisting of InN, InGaN, InNAs and InNSb, and (3) an InAsSb layer corresponding to twice the grating constant (a plane) of GaN, and the like may be introduced as the voltage reducing layer 90. Al, Ga, N, As, P, Sb and the like may be contained therein.

While description is given with the rising voltages Vr and Vr' of the thyristor here, the same applies to hold voltages Vh and Vh' which are the lowest voltages at which the thyristor maintains ON state and to a voltage applied to the thyristor that is in ON state (see (c) of FIG. 8).

On the other hand, the switching voltage Vs of the thyristor depends on the depletion layer of the reverse-biased semiconductor layer. Therefore, the voltage reducing layer 90 hardly affects the switching voltage Vs of the thyristor.

That is, the voltage reducing layer 90 decreases the rising voltage Vr while maintaining the switching voltage Vs of the thyristor. Thereby, the voltage applied to the thyristor being in ON state is reduced, so that consumed power is reduced. The switching voltage Vs of the thyristor is set to a given value by adjusting the materials, impurity concentrations and the like of the p anode layer 81, the n gate layer 82, the p gate layer 83 and the n cathode layer 84. However, the switching voltage Vs changes according to the position of insertion of the voltage reducing layer 90.

<Tunnel Junction Layer 85>

Figure 10:
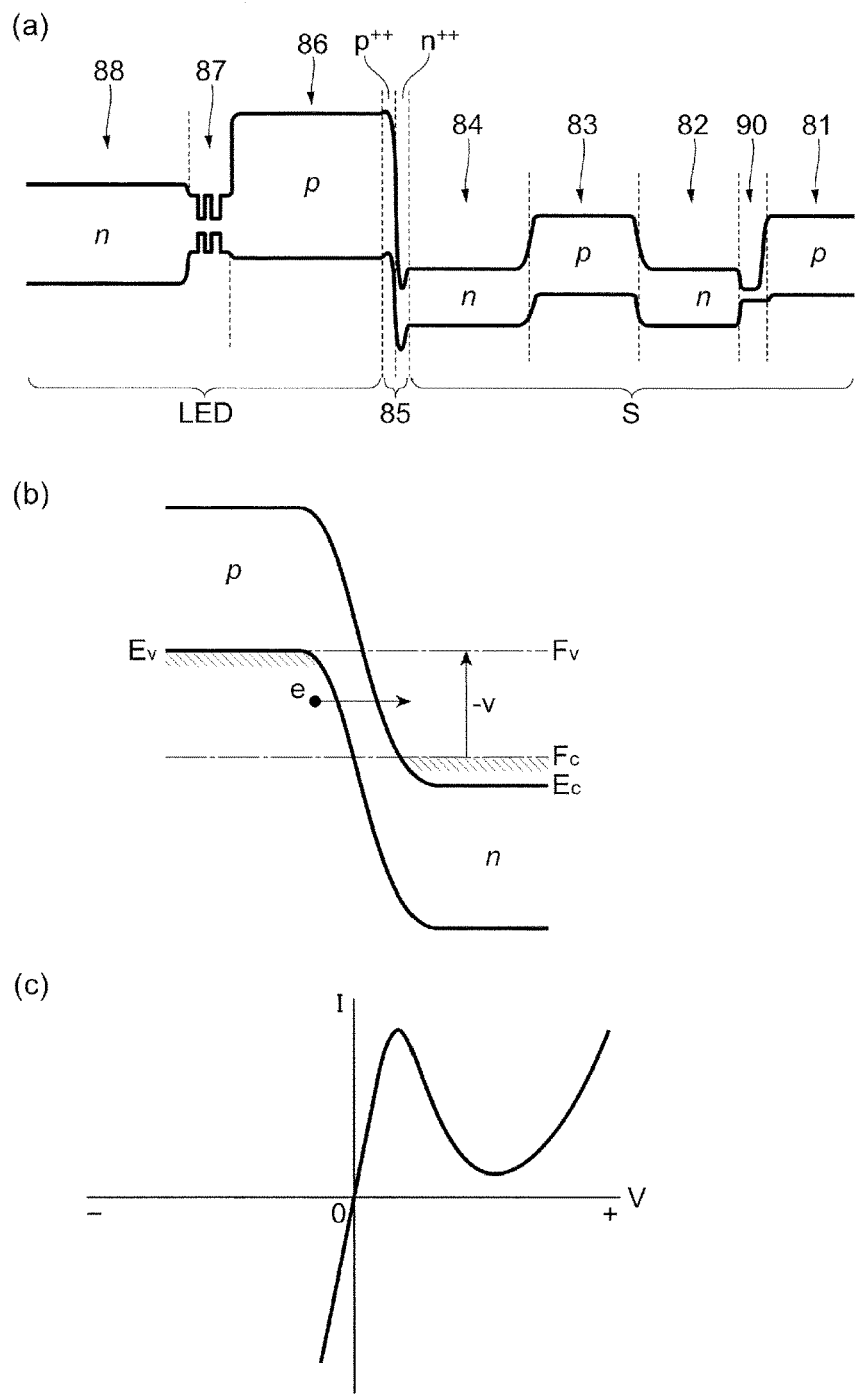
FIG. 10 is views further explaining the lamination structure of the setting thyristor and the light emitting diode, in which (a) is a schematic energy band diagram in the lamination structure of the setting thyristor and the light emitting diode, (b) is an energy band diagram in the reverse bias state of a tunnel junction layer, and (c) shows a current-voltage characteristic of the tunnel junction layer.

FIG. 10 is views further explaining the lamination structure of the setting thyristor S and the light emitting diode LED. (a) of FIG. 10 is a schematic energy band diagram in the lamination structure of the setting thyristor S and the light emitting diode LED, (b) of FIG. 10 is an energy band diagram in the reverse bias state of the tunnel junction layer 85, and (c) of FIG. 10 shows a current-voltage characteristic of the tunnel junction layer 85.

As shown in the energy band diagram of (a) of FIG. 10, when a voltage is applied between then ohmic electrode 321 and the reverse side electrode 92 of FIG. 7 so that the light emitting diode LED and the setting thyristor S are forward-biased, the part of the tunnel junction layer 85 between the $n^{++}$ layer 85a and the $p^{++}$ layer 85b is reverse-biased.

The tunnel junction layer 85 (tunnel junction) is a junction of the $n^{++}$ layer 85a to which an n-type impurity is added at a high concentration and the $p^{++}$ layer 85b to which a p-type impurity is added at a high concentration. For this reason, the width of the depletion region is small, and when the tunnel junction layer 85 is forward-biased, electrons tunnel from the conduction band on the side of the $n^{++}$ layer 85a to the valence band on the side of the $p^{++}$ layer 85b. In this case, a negative resistance characteristic appears.

On the other hand, as shown in (b) of FIG. 10, in the tunnel junction layer 85 (tunnel junction), when it is reverse-biased (−V), the potential Ev of the valence band on the side of the $p^{++}$ layer 85b is higher than the potential Ec of the conduction band on the side of the $n^{++}$ layer 85a. Then, electrons tunnel from the valence band of the $p^{++}$ layer 85b to the conduction band of the side of the $n^{++}$ layer 85a. And the higher the reverse bias voltage (−V) is, the more easily electrons tunnel. That is, as shown in (c) of FIG. 10, in the tunnel junction layer 85 (tunnel junction), current easily flows under reverse bias.

Therefore, as shown in (a) of FIG. 10, when the setting thyristor S turns on, even if the tunnel junction layer 85 is reverse-biased, current flows between the setting thyristor S and the light emitting diode LED. Thereby, the light emitting diode LED emits light (is lit).

Here, the setting thyristor S comes into a state of being able to shift to ON state when the connected transfer thyristor T turns on into ON state. When the lighting signal φI becomes "L", the setting thyristor S turns on into ON state, and the light emitting diode LED is lit (lighting is set). Therefore, it is designated as "setting thyristor" in the present description.

<Thyristor>

Next, the basic operation of the thyristor (the transfer thyristor T, the setting thyristor S) will be described. The thyristor is, as described above, a semiconductor device having three terminals of an anode terminal (anode), a cathode terminal (cathode) and a gate terminal (gate), and is formed by laminating on the substrate 80, for example, p-type semiconductor layers (the p anode layer 81, the p gate layer 83) of GaAs, GaAlAs, AlAs and the like, n-type semiconductor layers (the n gate layer 82, the n cathode layer 84) and Ge or the voltage reducing layer 90 containing Ge. As described above, the voltage reducing layer 90 works as the p type or the n type. Here, as an example, the forward potential (diffusion potential) Vd of the pn junction formed of a p-type semiconductor layer and an n-type semiconductor layer is made 1.5 V as an example.

Description will be given, for example, on the assumption that the voltage between the cathode and anode of the thyristor being in ON state is 1 V which is lower than the forward potential Vd (1.5 V) of the pn junction by the voltage reducing layer 90. When the voltage reducing layer 90 is not provided, the voltage between the cathode and anode of the thyristor being in ON state is the forward potential Vd (1.5 V) of the pn junction. In the following description, by providing the voltage reducing layer 90, the voltage between the cathode and anode of the thyristor being in ON state is lower by 0.5 V. The voltage between the cathode and anode of the thyristor being in ON state depends on the voltage reducing layer 90 being used.

Further, as an example, description will be given on the assumption that the reference potential Vsub supplied to the reverse side electrode 92 (see FIG. 5 and FIG. 6) which is the Vsub terminal is 0 V as a high level potential (hereinafter, referred to as "H") and the power source potential Vga supplied to the Vga terminal is −3.3 V as a low level potential (hereinafter, referred to as "L").

The anode of the thyristor is the reference potential Vsub ["H" (0 V)] supplied to the reverse side electrode 92.

The thyristor being in OFF state where no current flows between the anode and the cathode shifts to ON state (turns on) when a potential (a negative potential with a high absolute value) lower than a threshold voltage is applied to the cathode. Here, the threshold voltage of the thyristor is a value obtained by subtracting the forward potential Vd (1.5 V) of the pn junction from the potential of the gate.

When the thyristor comes into ON state, the gate of the thyristor is at a potential close to the potential of the anode terminal. Here, it is assumed that the gate is at 0 V ("H") since the anode is set at the reference potential Vsub ["H" (0 V)]. Moreover, the cathode of the thyristor being in ON state is −1 V.

The thyristor being in ON state shifts to OFF state (turns off) when the potential of the cathode becomes a higher potential (negative potential with a low absolute value, 0V or a positive potential) than the potential (potential close to the above-mentioned −1 V) necessary to maintain ON state.

On the other hand, when a potential (negative potential with a high absolute value) lower than the potential necessary to maintain ON state is continuously applied to the cathode of the thyristor being in ON state and a current (maintaining current) that can maintain ON state is supplied, the thyristor maintains ON state.

The setting thyristor S is laminated with the light emitting diode LED, and connected in series. Therefore, the voltage applied to the cathode (the n cathode layer 84) of the setting thyristor S is a voltage which is the potential of the lighting signal φI divided by the setting thyristor S and the light emitting diode LED. Here, description will be given on the assumption that −3.3 V is applied to the setting thyristor S when the setting thyristor S is in OFF state. The lighting signal φI ("Lo" described later) applied when the light emitting diode LED is lit is, for example, −5 V. Thereby, 1.7 V is applied between the anode and cathode of the light emitting diode LED. In the following, description will be given on the assumption that the voltage applied to the light emitting diode LED is −1.7 V. Although it is necessary to change the voltage applied to the light emitting diode LED according to the emission wavelength and emission amount, in doing so, the lighting signal φI ("Lo") supplied to the φI terminal is adjusted.

Since the n gate layer 82 and the p gate layer 83 of the thyristor are formed of a semiconductor such as GaAs, there are cases where light emission occurs between the n gate layer 82 and the p gate layer 83 in ON state. The amount of light emitted by the thyristor depends on the area of the cathode and the current flowing between the cathode and the anode. Therefore, when the light emission from the thyristor is not used, for example, at the transfer thyristor T, unnecessary light may be suppressed by decreasing the area of the cathode or by intercepting light by an electrode (the n ohmic electrode 323 of the transfer thyristor T1).

(Operation of the Light Emitter 65)

Next, the operation of the light emitter 65 will be described.

As described above, the light emitter 65 is provided with the light emitting chips C1-C40 (see FIGS. 3 and 4).

Since the light emitting chips C1-C40 are driven in parallel, it is only necessary to describe the operation of the light emitting chip C1.

<Timing Chart>

Figure 11:
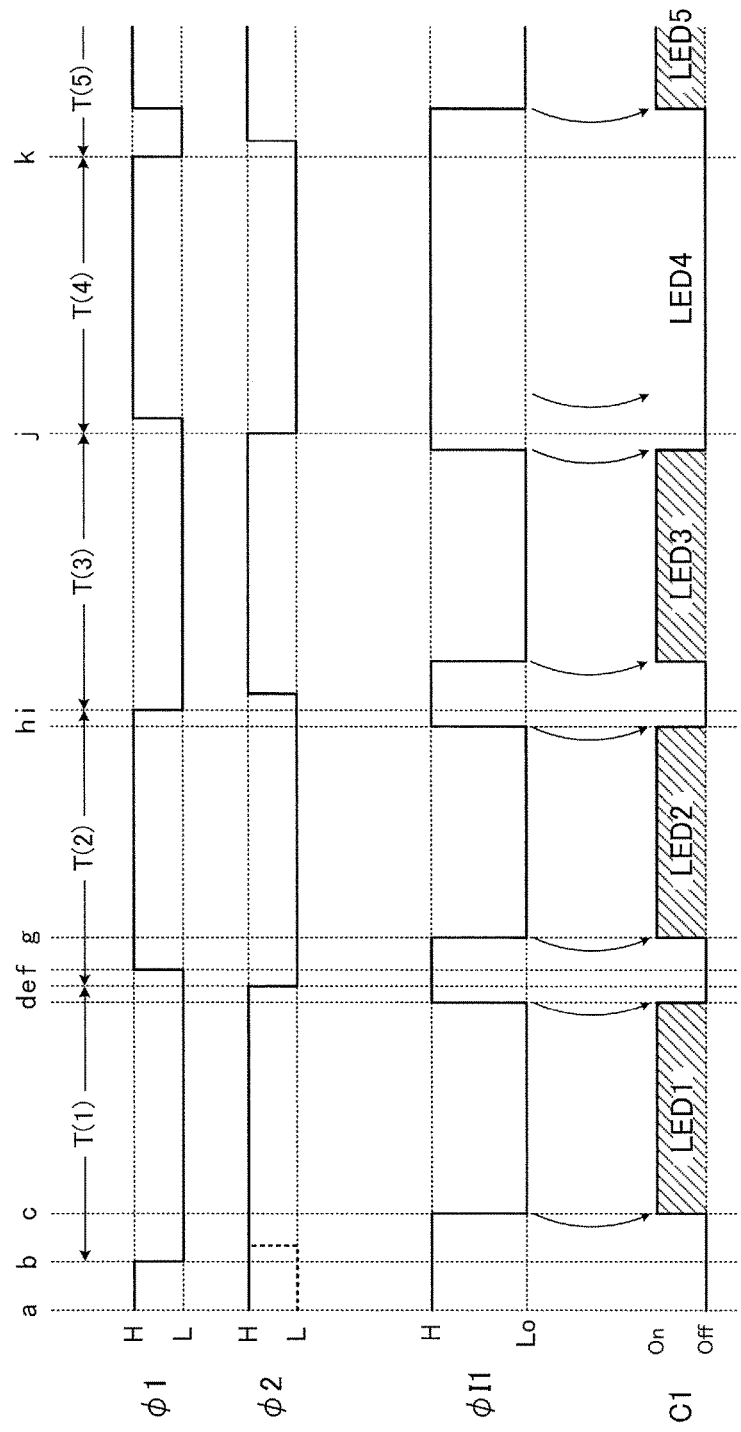
FIG. 11 is a timing chart explaining the operation of the light emitter and the light emitting chip.

FIG. 11 is a timing chart explaining the operation of the light emitter 65 and the light emitting chip C.

In FIG. 11, a timing chart of the portion that controls lighting or non-lighting of five light emitting diodes LED, the light emitting diodes LED1-LED5, of the light emitting chip C1 (referred to as lighting control). In FIG. 9, the light emitting diodes LED1, LED2, LED3 and LED5 of the light emitting chip C1 are lit, and the light emitting diode LED4 is OFF (non-lighting).

In FIG. 11, it is assumed that time passes in alphabetical order from the time a to the time k. The light emitting diode LED1 undergoes control of lighting or non-lighting (lighting control) in the period T (1); the light emitting diode LED2, in the period T (2); the light emitting diode LED3, in the period T (3); and the light emitting diode LED4, in the period T (4). Thereafter, the light emitting diodes LED with the numbers not less than 5 undergo lighting control in a similar manner.

Here, the periods T (1), T (2), T (3), . . . are periods of the same length, and are referred to as the period T when not distinguished from one another.

The first transfer signal φ1 transmitted to the φ1 terminal (see FIG. 5 and FIG. 6) and the second transfer signal φ2 transmitted to the φ2 terminal (see FIG. 5 and FIG. 6) are signals having two potentials of "H" (0 V) and "L" (−3.3 V). In the first transfer signal φ1 and the second transfer signal φ2, the waveform is repeated with two continuous periods T (for example, the period T(1) and the period T (2)) as a unit.

In the following, "H" (0 V) and "L" (−3.3 V) are sometimes abbreviated as "H" and "L".

The first transfer signal φ1 shifts from "H" (0 V) to "L" (−3.3 V) at the start time b of the period T (1) and shifts from "L" to "H" at the time f. Then, at the end time i of the period T (2), it shifts from "H" to "L".

The second transfer signal φ2 is "H" (0 V) at the start time b of the period T (1), and shifts from "H" (0 V) to "L" (−3.3 V) at the time e. Then, at the end time i of the period T (2), it shifts from "L" to "H".

Comparing the first transfer signal φ1 and the second transfer signal φ2, the second transfer signal φ2 is the first transfer signal φ1 shifted backward by the period T on the time axis. On the other hand, in the second transfer signal φ2, in the period T (1), the waveform indicated by the broken line and the waveform in the period T (2) are repeated in the period T (3) and succeeding periods. The reason why the waveform of the second transfer signal φ2 in the period T (1) is different from that in the period T (3) and succeeding periods is that the period T (1) is a period when the light emitter 65 starts its operation.

As described later, a pair of transfer signals, the first transfer signal φ1 and the second transfer signal φ2, propagate the ON state of the transfer thyristors T in numerical order to thereby specify the light emitting diodes LED of the same numbers as the transfer thyristors T as the objects of control of lighting or non-lighting (lighting control).

Next, the lighting signal φI1 transmitted to the φ1 terminal of the light emitting chip C1 will be described. To the other light emitting chips C2-C40, the lighting signals φI2-φI140 are transmitted, respectively. The lighting signal φI1 is a signal having two potentials of "H" (0 V) and "Lo" (−5 V).

Here, in the period T (1) of the lighting control on the light emitting diode LED1 of the light emitting chip C1, the lighting signal φI1 will be described. The lighting signal φI1 is "H" (0 V) at the start time b of the period T (1), and shifts from "H" (0 V) to "L" (−3.3 V) at the time c. Then, it shifts from "L" to "H" at the time d, and maintains "H" at the time e.

Referring to FIG. 4 and FIG. 5, the operations of the light emitter 65 and the light emitting chip C1 will be described according to the timing chart shown in FIG. 11. In the following, the periods T(1) and T (2) during which lighting control of the light emitting diodes LED1 and LED2 is performed will be described.

(1) Time a

<Light Emitter 65>

At the time a, the reference potential supplying portion 160 of the signal generating circuit 110 of the light emitter 65 sets the reference potential Vsub to "H" (0 V). The power source potential supplying portion 170 sets the power source potential Vga to "L" (−3.3 V). Then, the power source line 200a on the circuit board 62 of the light emitter 65 becomes "H" (0 V) of the reference potential Vsub, and the Vsub terminals of the light emitting chips C1-C40 become "H". Likewise, the power source line 200b becomes "L" (−3.3 V) of the power source potential Vga, and the Vga terminals of the light emitting chips C1-C40 become "L" (see FIG. 4). Thereby, the power source lines 71 of the light emitting chips C1-C40 become "L" (see FIG. 5).

Then, the transfer signal generating portion 120 of the signal generating circuit 110 sets each of the first transfer signal φ1 and the second transfer signal φ2 to "H" (0 V). Then, the first transfer signal line 201 and the second transfer signal line 202 become "H" (see FIG. 4). Thereby, the φ1 terminal and the φ2 terminal of each of the light emitting chips C1-C40 become "H". The potential of the first transfer signal line 72 connected to the φ1 terminal through the current limiting resistor R1 also becomes "H", and the second transfer signal line 73 connected to the φ1 terminal through the current limiting resistor R2 also becomes "H" (see FIG. 5).

Further, the lighting signal generating portion 140 of the signal generating circuit 110 sets each of the lighting signals φI1-φI40 to "H" (0 V). Then, the lighting signal lines 204-1-204-40 become "H" (see FIG. 4). Thereby, the φI terminal of each of the light emitting chips C1-C40 becomes "H" through the current limiting resistor R1, and the lighting signal line 75 connected to the φI terminal also becomes "H" (0 V) (see FIG. 5).

<Light Emitting Chip C1>

The anode terminals of the transfer thyristors T and the setting thyristors S are set to "H" since they are connected to the Vsub terminal.

The cathodes of the odd-numbered transfer thyristors T1, T3, T5, . . . are connected to the first transfer signal line 72 and set to "H" (0 V). The cathodes of the even-numbered transfer thyristors T2, T4, T6, . . . are connected to the second transfer signal line 73 and set to "H". Therefore, the transfer thyristors T are in OFF state since the anodes and the cathodes are both "H".

The cathode terminals of the light emitting diodes LED are connected to the lighting signal line 75 "H" (0 V). That is, the light emitting diodes LED and the setting thyristors S are connected in series through the tunnel junction layer 85. Since the cathodes of the light emitting diodes LED are "H" and the anodes of the setting thyristors S are "H", the light emitting diodes LED and the setting thyristors S are in OFF state.

The gate Gt1 is connected to the cathode of the start diode SD as mentioned above. The gate Gt1 is connected to the power source line 71 of the power source potential Vga ["L" (−3.3 V)] through the power source line resistor Rg1. And the anode terminal of the start diode SD is connected to the second transfer signal line 73, and connected to the φ2 terminal of "H" (0 V) through the current limiting resistor R2. Therefore, the start diode SD is forward-biased, and the cathode (the gate Gt1) of the start diode SD becomes a value (−1.5 V) obtained by subtracting the forward potential Vd (1.5 V) of the pn junction from the potential ["H" (0 V)] of the anode of the start diode SD. Moreover, when the gate Gt1 becomes −1.5 V, the coupling diode D1 becomes forward-biased since the anode (the gate Gt1) is −1.5 V and the cathode is connected to the power source line 71 ["L" (−3.3V)] through the power source line resistor Rg2. Therefore, the potential of the gate Gt2 becomes −3 V obtained by subtracting the forward potential Vd (1.5 V) of the pn junction from the potential (−1.5 V) of the gate Gt1. However, the gates Gt with the numbers not less than 3 are not affected by the anode of the start diode SD being "H" (0V), and the potentials of these gates Gt are "L" (−3.3 V) which is the potential of the power source line 71.

Since the gates Gt are the gates Gs, the potentials of the gates Gs are the same as the potentials of the gates Gt. Therefore, the threshold voltages of the transfer thyristors T and the setting thyristors S are values obtained by subtracting the forward potential Vd (1.5 V) of the pn junction from the potentials of the gates Gt and Gs. That is, the threshold voltages of the transfer thyristor T1 and the setting thyristor S1 are −3 V, the threshold voltages of the transfer thyristor T2 and the setting thyristor S2 are −4.5 V, and the threshold voltages of the transfer thyristors T and the setting thyristors S with the numbers not less than 3 are −4.8 V.

(2) Time b

At the time b shown in FIG. 11, the first transfer signal φ1 shifts from "H" (0 V) to "L" (−3.3 V). Thereby, the light emitter 65 starts its operation.

When the first transfer signal φ1 shifts from "H" to "L", the potential of the first transfer signal line 72 shifts from "H" (0 V) to "L" (−3.3 V) through the φ1 terminal and the current limiting resistor R1. Then, the transfer thyristor T1 the threshold voltage of which is −3 V turns on. However, the transfer thyristors T with the odd numbers not less than 3 and the cathode terminals of which are connected to the first transfer signal line 72 cannot turn on since the threshold voltage is −4.8 V. On the other hand, the even-numbered transfer thyristors T cannot turn on since the second transfer signal φ2 is "H" (0 V) and the second transfer signal line 73 is "H" (0 V).

By the transfer thyristor T1 turning on, the potential of the first transfer signal line 72 becomes −1 V from the potential ["H" (0 V)] of the anode.

When the transfer thyristor T1 turns on, the potential of the gate Gt1/Gs1 becomes "H" (0 V) which is the potential of the anode of the transfer thyristor T1. Then, the potential of the gate Gt2 (the gate Gs2) becomes −1.5 V, the potential of the gate Gt3 (the gate Gs3) becomes −3 V, and the potentials of the gates Gt (the gates GI) with the numbers not less than 4 become "L".

Thereby, the threshold voltage of the setting thyristor S1 becomes −1.5 V, the threshold voltages of the transfer thyristor T2 and the setting thyristor S2 become −3 V, the threshold voltages of the transfer thyristor T3 and the setting thyristor S3 become −4.5 V, and the threshold voltages of the transfer thyristors T and the setting thyristors S with the numbers not less than 4 becomes −4.8 V.

However, since the first transfer signal line 72 has become −1 V because of the transfer thyristor T1 being in ON state, the odd-numbered transfer thyristors T being in OFF state do not turn on. Since the second transfer signal line 73 is "H" (0 V), the even-numbered transfer thyristors T do not turn on. Since the lighting signal line 75 is "H" (0 V), none of the light emitting diodes LED is lit.

Immediately after the time b (here, the time when a steady state is brought about after a change of the thyristor or the like occurs because of the change of the potential of the signal at the time b), the transfer thyristor T1 is in ON state, and the other transfer thyristors T, the setting thyristors S and the light emitting diodes LED are in OFF state.

(3) Time c

At the time C, the lighting signal φI1 shifts from "H" (0 V) to "Lo" (−5 V).

When the lighting signal φ1 shifts from "H" to "Lo", the lighting signal line 75 shifts from "H" (0 V) to "Lo" (−5 V) through the current limiting resistor RI and the φI terminal. Then, the voltage divided between the anodes and cathodes of the setting thyristors S becomes −3.3 V. Then, the setting thyristor S1 the threshold voltage of which is −1.5 V turns on, so that the light emitting diode LED1 is lit (emits light). Thereby, since the voltage between the anode and cathode of the setting thyristor S1 becomes −1 V, the potential of the lighting signal line 75 becomes a potential close to −2.7 V. Although the threshold voltage of the setting thyristor S2 is −3 V, since the voltage applied to the setting thyristor S2 is −1 V obtained by adding a voltage of 1.7 V applied to the light emitting diodes LED to −2.7 V, the setting thyristor S2 does not turn on.

Immediately after the time c, the light emitting diode LED1 is lit (emits light) under a condition where the transfer thyristor T1 and the setting thyristor S1 are in ON state.

(4) Time d

At the time d, the lighting signal φI1 shifts from "Lo" (−5 V) to "H" (0 V).

When the lighting signal φI1 shifts from "Lo" to "H", the potential of the lighting signal line 75 shifts from −2.7 V to "H" (0 V) through the current limiting resistor RI and the φI terminal. Then, since the cathode of the light emitting diode LED1 and the anode of the setting thyristor S1 both become "H", the setting thyristor S1 turns off and the light emitting diode LED1 turns off (non-lighting). The lighting period of the light emitting diode LED1 is a period during which the lighting signal φI1 is "Lo" (−5 V) from the time c when the lighting signal φI1 shifts from "H" to "Lo" to the time d when the lighting signal φI1 shifts from "Lo" to "H".

Immediately after the time d, the transfer thyristor T1 is in ON state.

(5) Time e

At the time e, the second transfer signal φ2 shifts from "H" (0 V) to "L" (−3.3V). Here, the period T(1) during which lighting control of the light emitting diode LED1 is performed ends, and the period T(2) during which lighting of the light emitting diode LED2 is controlled starts.

When the second transfer signal φ2 shifts from "H" to "L", the potential of the second transfer signal line 73 shifts to −1 V through the φ2 terminal. As mentioned above, the transfer thyristor T2 turns on since the threshold voltage has become −3 V. Thereby, the potential of the gate terminal Gt2 (the gate terminal Gs2) becomes "H" (0 V), the potential of the gate Gt3 (the gate Gs3) becomes −1.5 V, and the potential of the gate Gt4 (the gate Gs4) becomes −3 V. Then, the potentials of the gates Gt (the gates Gs) with the numbers not less than 5 become −3.3 V.

Immediately after the time e, the transfer thyristors T1 and T2 are in ON state.

(6) Time f

At the time f, the first transfer signal φ1 shifts from −1 V to "H" (0 V).

When the first transfer signal φ1 shifts from −1 V to "H", the potential of the first transfer signal line 72 shifts from −1 V to "H" through the φ1 terminal. Then, the transfer thyristor T1 being in ON state turns off as the anode and the cathode both become "H". Then, the potential of the gate Gt1 (the gate Gs1) changes toward the power source potential Vga ["L" (−3.3 V)] of the power source line 71 through the power source line resistor Rg1. This brings the coupling diode D1 into a condition where the potential is applied in a direction where no current flows (reverse bias). Consequently, the influence of the gate Gt2 (the gate Gs2) being "H" (0 V) does not reach the gate Gt1 (the gate Gs1). That is, the transfer thyristors T having the gates Gt connected by the reverse-biased coupling diodes D do not turn on at the first transfer signal φ1 or the second transfer signal φ2 of "L" (−3.3 V) as the threshold voltage becomes −4.8 V.

Immediately after the time f, the transfer thyristor T2 is in ON state.

(7) Others

When the lighting signal φI1 shifts from "H" (0 V) to "Lo" (−5 V) at the time g, similarly to the setting thyristor S1 and the light emitting diode LED1 at the time c, the setting thyristor S1 turns on, and the light emitting diode LED2 is lit (emits light).

Then, when the lighting signal φI1 shifts from "Lo" (−5 V) to "H" (0 V) at the time h, similarly to the setting thyristor S1 and the light emitting diode LED1 at the time d, the setting thyristor S2 turns off, and the light emitting diode LED2 turns off.

Further, when the first transfer signal φ1 shifts from "H" (0 V) to "L" (−3.3 V) at the time i, similarly to the transfer thyristor T1 at the time b or the transfer thyristor T2 at the time e, the transfer thyristor T3 the threshold voltage of which is −3 V turns on. At the time i, the period T(2) during which lighting control of the light emitting diode LED2 is performed ends, and the period T(3) during which lighting control of the light emitting diode LED3 is performed starts.

Thereafter, what has been described heretofore is repeated.

When the light emitting diodes LED are not lit (not made to emit light) and are made to remain off (non-lighting), like the lighting signal φI1 shown from the time j to the time k in the period T(4) during which lighting control of the light emitting diode LED4 is performed in FIG. 11, the lighting signal φI is kept "H" (0 V). By doing this, even if the threshold voltage of the setting thyristor S4 is −1.5 V, the setting thyristor S4 does not turn on, and the light emitting diode LED4 remains off (non-lighting).

As described above, the gate terminals Gt of the transfer thyristors T are interconnected by the coupling diodes D. Therefore, when the potential of a gate Gt is changed, the potential of the gate Gt connected to the potential-changed gate Gt through the forward-biased coupling diode D is changed. Then, the threshold voltage of the transfer thyristor T having the potential-changed gate is changed. If the threshold voltage is higher than "L" (−3.3 V) (a negative value the absolute value of which is low), the transfer thyristor T turns on at the time when the first transfer signal φ1 or the second transfer signal φ2 shifts from "H" (0 V) to "L" (−3.3 V).

And since the threshold voltage is −1.5 V, the setting thyristors S the gates Gs of which are connected to the gates Gt of the transfer thyristors T being in ON state turn on when the lighting signals φI shift from "H" (0 V) to "Lo" (−5 V), and the light emitting diodes LED connected to the setting thyristors S in series turn on (emit light).

That is, by becoming on, the transfer thyristors T specify the light emitting diodes LED that are objects of lighting control, and the lighting signals φI of "Lo" (−5 V) turn on the setting thyristors S series-connected to the light emitting diodes LED that are objects of lighting control and light the light emitting diodes LED.

The lighting signals φI of "H" (0 V) maintain the setting thyristors S in OFF state, and maintain the light emitting diodes LED off. That is, the lighting signals φI set lighting/non-lighting of the light emitting diodes LED.

As described above, by setting the lighting signals φI according to the image data, lighting or non-lighting of the light emitting diodes LED is controlled.

(Manufacturing Method of the Light Emitting Chips C)

The manufacturing method of the light emitting chips C will be described. Here, description will be given with the cross-sectional view of the island 301 where the setting thyristor S and the light emitting diode LED are laminated shown in FIG. 7.

Figure 12:
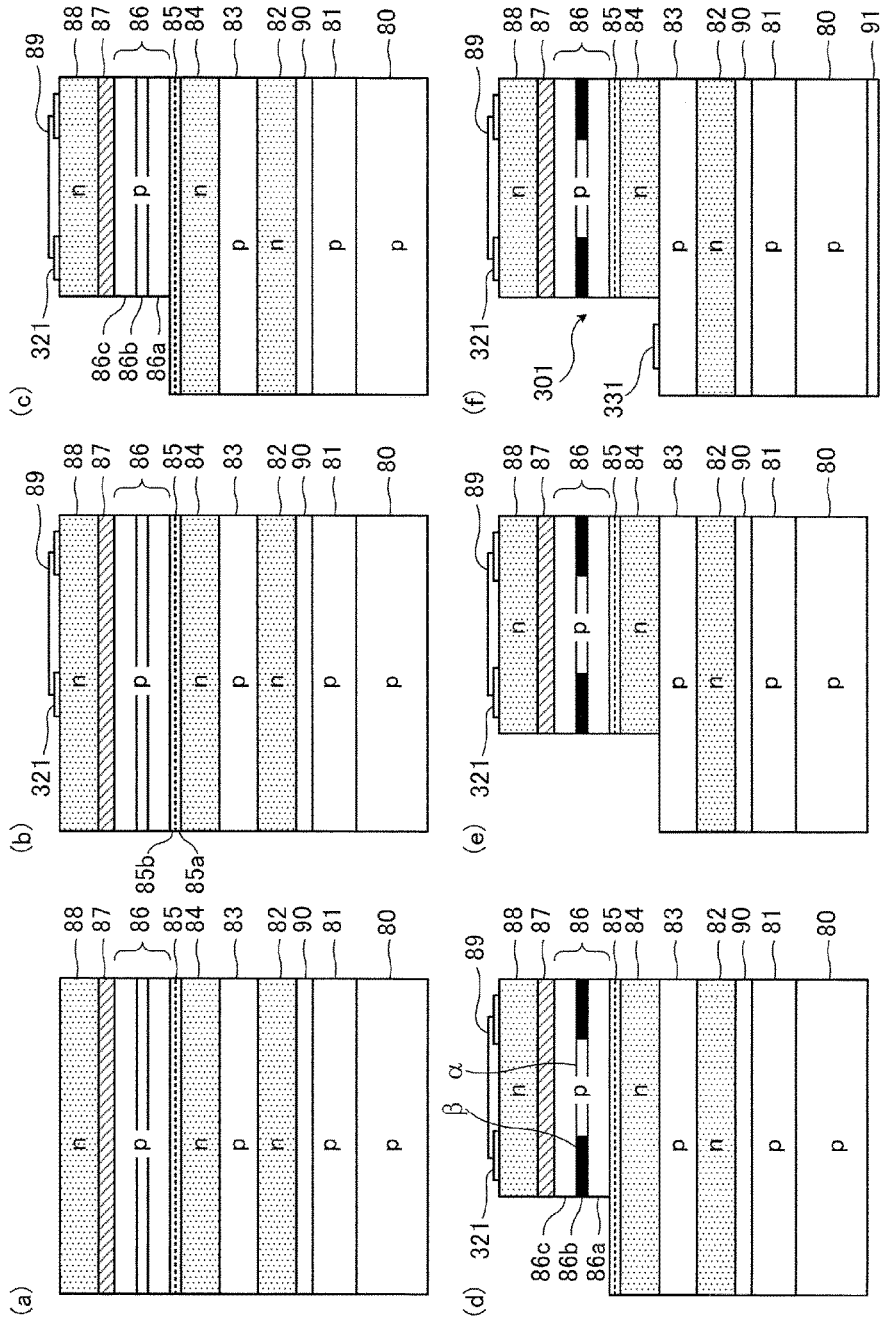
FIG. 12 is views explaining the manufacturing method of the light emitting chips, in which (a) is a semiconductor laminate forming step, (b) is an n ohmic electrode and light exit port protecting layer forming step, (c) is a tunnel junction layer exposing etching step, (d) is a step of current blocking portion formation on a current constricting layer, (e) is a p gate layer exposing etching step, and (f) is a p ohmic electrode and reverse side electrode forming step.

FIG. 12 is views explaining the manufacturing method of the light emitting chips C. (a) of FIG. 12 is a semiconductor laminate forming step, (b) of FIG. 12 is an n ohmic electrode 321 and light exit port protecting layer 89 forming step, (c) of FIG. 12 is a tunnel junction layer 85 exposing etching step, (d) of FIG. 12 is a step of current blocking portion β formation on the current constricting layer 86b, (e) of FIG. 12 is a p gate layer 83 exposing etching step, and (f) of FIG. 12 is a p ohmic electrode 331 and reverse side electrode 92 forming step.

In (a)-(f) of FIG. 12, there are cases where plural steps are shown collectively.

These will be described in sequence.

At the semiconductor laminate forming step shown in (a) of FIG. 12, a semiconductor laminate is formed by epitaxially growing the p anode layer 81, the voltage reducing layer 90, the n gate layer 82, the p gate layer 83, the n cathode layer 84, the tunnel junction layer 85, the p anode layer 86, the light emitting layer 87 and the n cathode layer 88 in sequence on the substrate 80.

Here, while the substrate 80 will be described with p-type GaAs as an example, n-type GaAs or i-type GaAs may be used. Moreover, Inp, GaN, InAs, sapphire, Si or the like may be used. When the substrate is changed, materials substantially matching (including a strain structure, a strain relaxation layer and metamorphic growth) to the grating constant of the substrate are used as the materials to be monolithically laminated (epitaxially grown) on the substrate. As an example, on the InAs substrate, InAs, InAsSb, GaInAsSb and the like are used, on the InP substrate, Inp, InGaAsP and the like are used, on the GaN substrate or on the sapphire substrate, GaN, AlGaN and InGaN are used, and on the Si substrate, Si, SiGe, GaP and the like are used. However, when the substrate is pasted to another supporting substrate after crystalline growth, it is unnecessary that the semiconductor materials be substantially grating-matched to the supporting substrate. As the supporting substrate, in addition to the above ones, substrates with high thermal conductivity such as hexagonal boron nitride (BN), aluminum nitride (AlN), diamond and graphite are cited.

The p anode layer 81 is, for example, p-type $Al_{0.9}GaAs$ with an impurity concentration of $1\times10^{18}/cm^3$. The Al composition may be changed in a range of 0-1. It may be GaInP or the like.

The voltage reducing layer 90 is, for example, Ge or AlGaAs containing Ge. A GaInNAs-based compound semiconductor may be used as long as it is a compound of GaAs and InP, a compound of InN and InSb, a compound of InN and InAs, a quaternary or higher mixture or the like that is low in bandgap energy. The voltage reducing layer 90 may be a quantum line (quantum wire) or a quantum box (quantum dot).

The n gate layer 82 is, for example, n-type $Al_{0.9}GaAs$ with an impurity concentration of $1\times10^{17}/cm^3$. The Al composition may be changed in a range of 0-1. It may be GaInP or the like.

The p gate layer 83 is, for example, p-type $Al_{0.9}GaAs$ with an impurity concentration of $1\times10^{17}/cm^3$. The Al composition may be changed in a range of 0-1. It may be GaInP or the like.

The n cathode layer 84 is, for example, n-type $Al_{0.9}GaAs$ with an impurity concentration of $1\times10^{18}/cm^3$. The Al composition may be changed in a range of 0-1. It may be GaInP or the like.

The tunnel junction layer 85 is formed of a junction of the $n^{++}$ layer 85a to which an n-type impurity is added at a high concentration and the $p^{+-}$ layer 85b to which an n-type impurity is added at a high concentration (see (b) of FIG. 10). The $n^{++}$ layer 85a and the $p^{-+}$ layer 85b have a high impurity concentration of, for example, $1\times1020/cm^3$. The impurity concentration of a normal junction is on the order of $10^{17}/cm^3$—on the order of $10^{18}/cm^3$. Combinations of the $n^{-+}$ layer 85a and the $p^{++}$ layer 85b (hereinafter, referred to as $n^{-+}$ layer 85a/$p^{++}$ layer 85b) are, for example, $n^{++}$GaInP/$p^{+-}$GaAs, $n^{++}$GaInP/$p^{++}$AlGaAs, $n^{++}$GaAs/$p^{++}$GaAs, $n^{++}$AlGaAs/$p^{++}$AlGaAs, $n^{++}$InGaAs/$p^{++}$InGaAs, $n^{++}$GaInAsP/$p^{++}$GaInAsP, and $n^{++}$GaAsSb/$p^{++}$GaAsSb. Combinations interchanged with each other may be used.

The p anode layer 86 is formed by sequentially laminating the lower side p layer 86a, the current constricting layer 86b and the upper side p layer 86c (see (c) of FIG. 12).

The lower side p layer 86a and the upper side p layer 86c are, for example, p-type $Al_{0.9}GaAs$ with an impurity concentration of, for example, $1\times10^{18}/cm^3$. The Al composition may be changed in a range of 0-1. They may be GaInP or the like.

The current constricting layer 86b is, for example, p-type AlGaAs where the impurity concentration of AlAs or Al is high. Any may be used that constricts the current path by $Al_2O_3$ being formed by the oxidation of Al to increase the electric resistance.

The light emitting layer 87 has a quantum well structure where well layers and barrier layers are laminated alternately. The well layers are, for example, GaAs, AlGaAs, InGaAs, GaAsP, GaInAs, AlGaInP, GaInAsP or GaInP, and the barrier layers are AlGaAs, GaAs, GaInP or GaInAsP. The light emitting layer 87 may be a quantum line (quantum wire) or a quantum box (quantum dot).

The n cathode layer 88 is, for example, n-type $Al_{0.9}GaAs$ with an impurity concentration of $1\times10^{18}/cm^3$. The Al composition may be changed in a range of 0-1. It may be GaInP or the like.

These semiconductor layers are laminated, for example, by the metal organic chemical vapor deposition (MOCVD) method or the molecular beam epitaxy (MBE) method to form a semiconductor laminate.

At the n ohmic electrode 321 and light exit port protecting layer 89 forming step shown in (b) of FIG. 12, first, the n ohmic electrode 321 is formed on the n cathode layer 88.

The n ohmic electrode 321 is, for example, Au (AuGe) containing Ge that easily establishes ohmic contact with an n-type semiconductor layer such as the n cathode layer 88.

The n ohmic electrode 321 is formed, for example, by the lift-off method.

Then, the light exit port protecting layer 89 is formed of a material having the property of transmitting the exiting light on a light exit port surrounded by the n ohmic electrode 321.

The light exit port protecting layer 89 is, for example, $SiO_2$, SiON or SiN.

The light exit port protecting layer 89 is formed, for example, by the lift-off method.

At the tunnel junction layer 85 exposing etching step shown in (c) of FIG. 12, the n cathode layer 88, the light emitting layer 87 and the p anode layer 86 on the tunnel junction layer 85 are removed by etching in the range of the light emitting diode LED.

This etching may be performed by wet etching using sulfuric acid etching liquid (sulfuric acid:hydrogen peroxide solution:water=1:10:300 in a ratio by weight) or the like; for example, it may be performed by anisotropic dry etching (RIE) using boron chloride.

At the step of current blocking portion β formation on the current constricting layer 86b shown in (d) of FIG. 12, the current constricting layer 86b the side surface of which is exposed by the tunnel junction layer 85 exposing etching step is oxidized from the side surface to form the current blocking portion β that blocks current. The part that remains without being oxidized becomes the current passing portion α.

For the oxidation from the side surface of the current constricting layer 86b, for example, Al of the current constricting layer 86b which is AlAs, AlGaAs or the like is oxidized by steam oxidation at 300-400 degrees C. At this time, oxidation proceeds from the exposed side surface, so that the current blocking portion β by $Al_2O_3$ which is an oxide of Al is formed around the light emitting diode LED.

The current blocking portion β may be formed by oxygen ion ($O^+$) implantation (ion implantation) instead of oxidation. That is, the current blocking portion β may be formed by implanting $O^+$ to the part to be formed into the current blocking portion β at times such as after the current constricting layer 86b is formed or after the upper side p layer 86c is formed.

Moreover, instead of providing the current constricting layer 86b, the p anode layer 86, the light emitting layer 87 and the n cathode layer 88 may be grown after the tunnel junction layer 85 is etched so that the tunnel junction layer 85 remains in the part corresponding to the current passing portion α. Since the junction of the n cathode layer 84 and the p anode layer 86 laminated without the tunnel junction layer 85 being interposed is reverse-biased, current does not flow easily. That is, the tunnel junction layer 85 provided in the part corresponding to the current passing portion α works as a current constricting layer.

At the p gate layer 83 exposing etching step shown in (e) of FIG. 12, the tunnel junction layer 85 and the n cathode layer 84 are etched to expose the p gate layer 83.

This etching may be performed by wet etching using sulfuric acid etching liquid (sulfuric acid:hydrogen peroxide solution:water=1:10:300 by weight); for example, it may be performed by anisotropic dry etching using boron chloride.

If the p gate layer 83 is exposed instead of exposing the tunnel junction layer 85 at the tunnel junction layer 85 exposing etching step shown in (c) of FIG. 12, there is a risk that the Al contained in the p gate layer 83 is oxidized in the current blocking portion β forming step in (d) of FIG. 10. For this reason, if the Al contained in the p gate layer 83 is oxidized, the surface becomes rough or the adhesiveness of the p ohmic electrode 331 becomes deteriorated. Therefore, the current blocking portion β forming step is performed with the tunnel junction layer 85 being exposed.

At the p ohmic electrode 331 and reverse side electrode 92 forming step shown in (f) of FIG. 12, first, the p ohmic electrode 331 is formed on the p gate layer 83.

The p ohmic electrode 331 is, for example, Au (AuZn) containing Zn that easily establishes ohmic contact with a p-type semiconductor layer such as the p gate layer 83.

The p ohmic electrode 331 is formed, for example, by the lift-off method. In this case, another p ohmic electrode may be formed at the same time.

Then, the reverse side electrode 92 is formed on the reverse surface of the substrate 80.

The reverse side electrode 92 is, for example, AuZn similarly to the p ohmic electrode 331.

In addition thereto, a step of forming the protecting layer 91, a step of forming a through hole in the protecting layer 91, a step of forming the line 75 and the like are included.

In the above, a method of manufacturing the light emitting chip C on the island 301 where the setting thyristor S and the light emitting diode LED are laminated is described.

The islands 302-306 including the transfer thyristors T, the coupling diodes D, the power source line resistors Rg and the current limiting resistors R1 and R2 are formed by adding, to the above-described steps, a step of exposing the surface of the n cathode layer 84 and a step of forming the n ohmic electrodes 323, 324 and 325.

While the p ohmic electrode 331 is provided on the p gate layer 83 to form the gate terminal Gs of the setting thyristor S in the above, the gate terminal of the setting thyristor S may be formed on the n gate layer 82.

As described above, on the light emitting chip C according to the first exemplary embodiment, the setting thyristors S and the light emitting diodes LED are laminated. Thereby, the light emitting chip C becomes a self-scanning type that successively lights the light emitting diodes LED by the transfer thyristors T and the setting thyristors S. Thereby, the number of terminals provided on the light emitting chip C is reduced, so that the light emitting chip C and the light emitter 65 are reduced in size.

There are cases where the setting thyristors S are used as light emitting devices without the light emitting diodes LED being provided on the setting thyristors S. That is, there are cases where light emission is used at the junction of the n gate layer 82 and the p gate layer 83 under the condition where the setting thyristors S are ON. In these cases, the transfer characteristic and light emission characteristic cannot be set separately (independently). For this reason, increase in driving speed, increase in light output, increase in efficiency, reduction in consumed power, reduction in cost and the like are difficult to achieve.

For example, using a thyristor (setting thyristor S) as the light emitting device, it is attempted to emit light of 780 nm. In this case, if it is attempted to form a quantum well structure by using AlGaAs, the Al composition is made 30%. In this case, if gate exposing etching is performed, Al is oxidized, so that the gate terminal cannot be formed.

On the contrary, in the first exemplary embodiment, light emission is performed by the light emitting diodes LED and transfer is performed by the transfer thyristors T and the setting thyristors S. Light emission and transfer are separated. It is unnecessary for the setting thyristor S to emit light. Therefore, the light emitting characteristic and the like can be improved by providing the light emitting diodes LED with a quantum well structure and the transfer characteristic by the transfer thyristors T and the setting thyristors S and the like can be improved. That is, the light emitting diodes LED of the light emitting portion 102 and the transfer thyristors T and the setting thyristors S of the transfer portion 101 can be set separately (independently). Thereby, increase in driving speed, increase in light output, increase in efficiency, reduction in consumed power, reduction in cost and the like are easily achieved.

Moreover, in the first exemplary embodiment, the light emitting diode LED and the setting thyristor S are laminated through the tunnel junction layer 85. In this case, although the light emitting diode LED is reverse-biased at the tunnel junction layer 85, the tunnel junction has the property of current flowing therethrough even in reverse-biased state.

Unless the tunnel junction layer 85 is provided, the junction between the light emitting diode LED and the setting thyristor S is reverse-biased. For this reason, in order to pass current through the light emitting diodes LED and the setting thyristor S, a voltage at which the reverse-biased junction yields is applied. That is, the driving voltage becomes high.

That is, by laminating the light emitting diode LED and the setting thyristor S through the tunnel junction layer 85, the driving voltage can be held down compared with when the tunnel junction layer 85 is not interposed.

Moreover, the current constricting layer 86b provided in the p anode layer 86 of the light emitting diode LED may be provided in the n cathode layer 88 of the light emitting diode LED, or may be provided on the p anode layer 81 and the n cathode layer 84 of the setting diode S.

Figure 13:
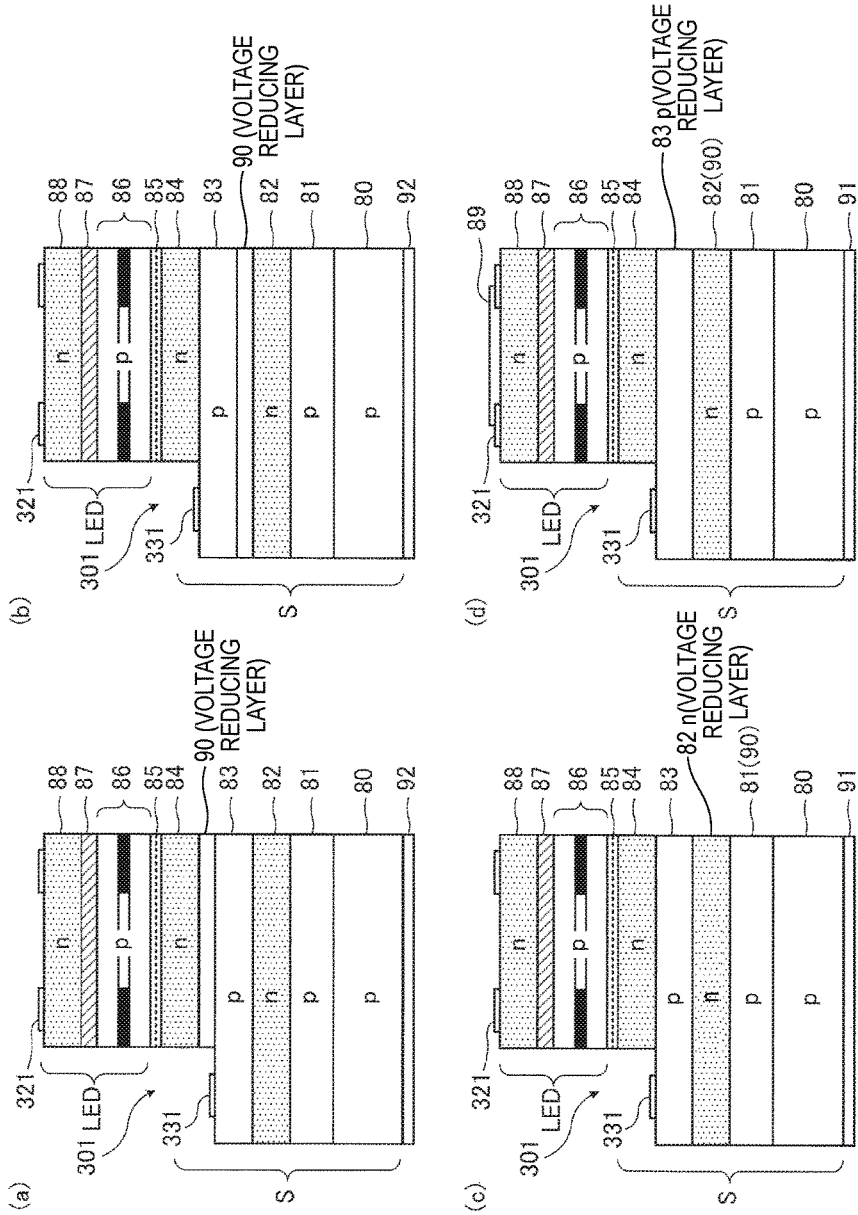
FIG. 13 is enlarged cross-sectional views of modifications of the island where the setting thyristor and the light emitting diode are laminated, in which (a) is a case where the voltage reducing layer is provided between a p gate layer and an n cathode layer of the setting thyristor, (b) is a case where the voltage reducing layer is provided between an n gate layer and the p gate layer of the setting thyristor, (c) is a case where the voltage reducing layer is the p gate layer, and (d) is a case where the voltage reducing layer is the n gate layer.

FIG. 13 is enlarged cross-sectional views of modifications of the island 301 where the setting thyristor S and the light emitting diode LED are laminated. (a) of FIG. 13 is a case where the voltage reducing layer 90 is provided between the p gate layer 83 and the n cathode layer 84 of the setting thyristor S, (b) of FIG. 13 is a case where the voltage reducing layer 90 is provided between the n gate layer 82 and the p gate layer 83 of the setting thyristor S, (c) of FIG. 13 is a case where the voltage reducing layer 90 is the n gate layer 82, and (d) of FIG. 13 is a case where the voltage reducing layer 90 is the p gate layer 83.

In the case of (a) of FIG. 13 where the voltage reducing layer 90 is provided between the p gate layer 83 and the n cathode layer 84 of the setting thyristor S, the voltage reducing layer 90 may be of a p type with an impurity concentration similar to that of the p gate layer 83 as part of the p gate layer 83, or may be of an n type with an impurity concentration similar to that of the n cathode layer 84 as part of the n cathode layer 84.

In the case of (b) of FIG. 13 where the voltage reducing layer 90 is provided between the n gate layer 82 and the p gate layer 83 of the setting thyristor S, the voltage reducing layer 90 may be of an n type with an impurity concentration similar to that of the n gate layer 82 as part of the n gate layer 82 or may be of a p type with an impurity concentration similar to that of the p gate layer 83 as part of the p gate layer 83.

When the voltage reducing layer 90 of (c) of FIG. 13 is the n gate layer 82, the voltage reducing layer 90 is of the p type with the impurity concentration of the n gate layer 82.

When the voltage reducing layer 90 of (d) of FIG. 13 is the p gate layer 83, the voltage reducing layer 90 is of the n type of the impurity concentration of the p gate layer 83.

When the voltage reducing layer 90 is provided between the p anode layer 81 and the n gate layer 82 like the light emitting chip C according to the first exemplary embodiment shown in FIG. 7, compared with the above-described modifications, the voltage reducing layer 90 is away from the p ohmic electrode 331 which is the gate Gs of the setting thyristor S. For this reason, after the setting thyristor S turns on, the effect of reducing the rising voltage by the voltage reducing layer 90 appears. That is, the voltage reducing layer 90 hardly affects the turning on of the setting thyristor S.

The voltage reducing layer 90 may be provided at the intermediate portion of each of the p anode layer 81, the n gate layer 82, the p gate layer 83 and the n cathode layer 84.

Moreover, while an example in which one voltage reducing layer 90 is provided is shown in the first exemplary embodiment, more than one voltage reducing layer 90 may be provided. For example, a case where the voltage reducing layer 90 is provided between the p anode layer 81 and the n gate layer 82 and between the p gate layer 83 and the n cathode layer 84, or the voltage reducing layer 90 may be provided one in the n gate layer 82 and another one in the p gate layer 83. In addition, it may be performed to select two or three layers from among the p anode layer 81, the n gate layer 82, the p gate layer 83 and the n cathode layer 84 and provide the voltage reducing layer 90 in each of the layers. The conductivity type of these voltage reducing layers may be matched to those of the anode layer, the cathode layer and the gate layer where the voltage reducing layers are provided or may be the i type. The same applies to the other exemplary embodiments.

Second Exemplary Embodiment

On the light emitting chip C according to a second exemplary embodiment, instead of the light emitting diodes LED in the first exemplary embodiment, laser diodes are used as the light emitting devices.

Except for the light emitting chip C, the remaining structure is similar to that of the first exemplary embodiment. Therefore, the light emitting chip C will be described, and description of similar portions is omitted.

Figure 14:
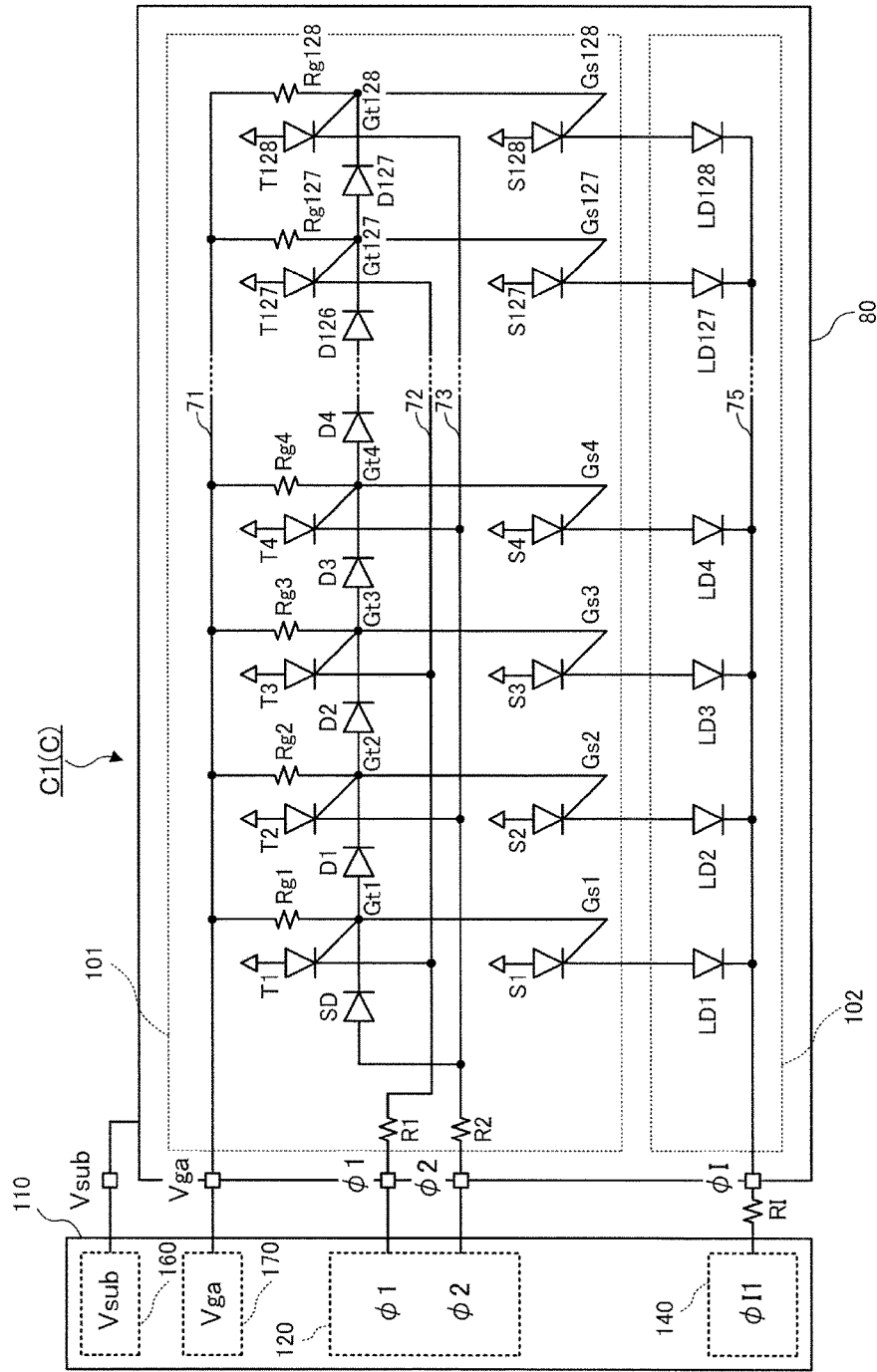
FIG. 14 is an equivalent circuit diagram explaining the circuit configuration of the light emitting chip mounted with a self-scanning type light emitting device array (SLED) according to a third exemplary embodiment.

FIG. 14 is an equivalent circuit diagram explaining the circuit configuration of the light emitting chip C mounted with a self-scanning type light emitting device array (SLED) according to the third exemplary embodiment. The light emitting diodes LED1-LED128 of FIG. 5 according to the first exemplary embodiment are laser diodes LD1-LD128 (referred to as the laser diode LD when not distinguished from one another). Description of the remaining structure which is similar to FIG. 5 is omitted.

Moreover, in the first exemplary embodiment, the light emitting diodes LED are replaced with the laser diodes LD also in the planar layout view and the cross-sectional view of the light emitting chip C shown in FIG. 6. Therefore, the planer layout view and the cross-sectional view of the light emitting chip C according to the second exemplary embodiment are omitted.

On the light emitting chip C according to the second exemplary embodiment, the setting thyristors S and the laser diodes LD are laminated (Laser Diode on Thyristor).

In the laser diodes LD, the light emitting layer 87 is sandwiched between two clad layers (hereinafter, referred to as clad layers). The clad layers are layers having a higher refractive index than the light emitting layer 87. The light exiting from the light emitting layer 87 is reflected at the interfaces between the light emitting layer 87 and the clad layers to trap the light within the light emitting layer 87. Then, resonance is caused by a resonator structured between the side surfaces of the light emitting layer 87 to cause laser oscillation. The light emitting layer 87 is sometimes referred to as active layer.

Figure 15:
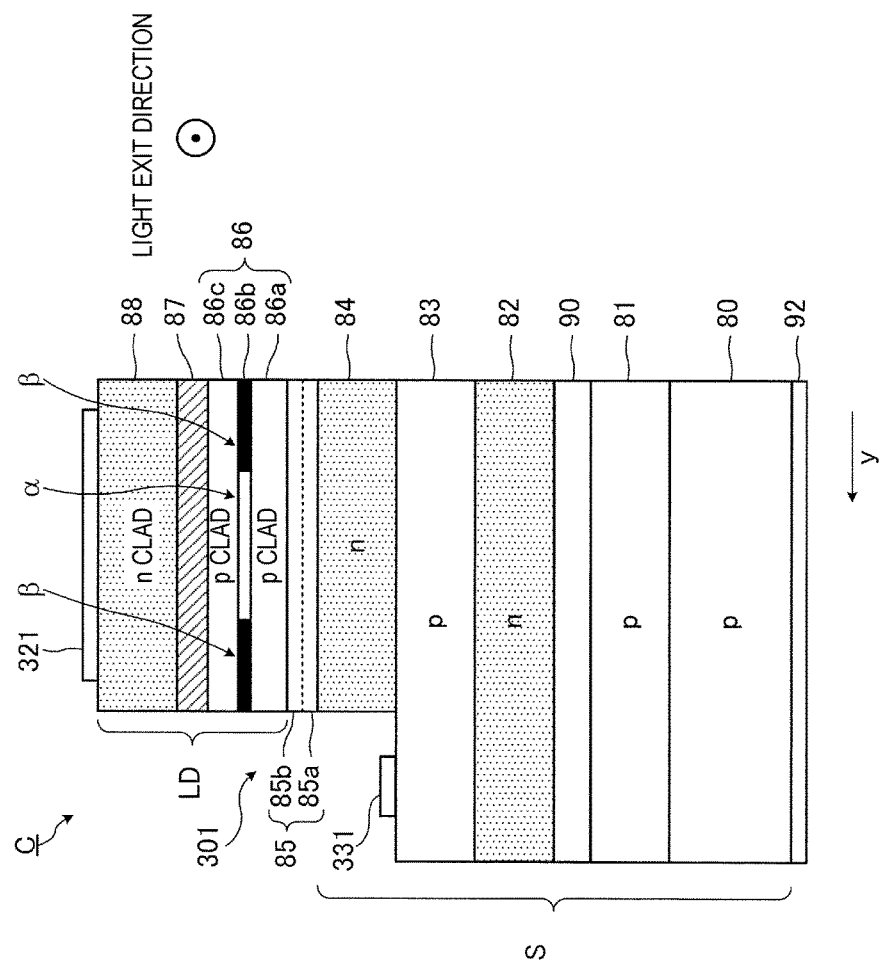
FIG. 15 is an enlarged cross-sectional view of the island of the light emitting chip according to the second exemplary embodiment where the setting thyristor and a laser diode are laminated.

FIG. 15 is an enlarged cross-sectional view of the island 301 of the light emitting chip C according to the second exemplary embodiment where the setting thyristor S and the laser diode LD are laminated.

On the light emitting chip C, the p anode layer 86 is formed of a p-type clad layer including the current constricting layer 86b. That is, the p anode layer 86 has its lower side p layer 86a and upper side p layer 86c formed as clad layers. The n cathode layer 88 is formed as a clad layer. The lower side p layer 86a, the upper side p layer 86c and the n cathode layer 88 are sometimes referred to as lower side p (clad) layer 86a, upper side p (clad) layer 86c and n cathode (clad) layer 88, respectively. The p anode layer 86 is sometimes referred to as p anode (clad) layer 86 as a whole.

The lower side p (clad) layer 86a and upper side p (clad) layer 86c of the p anode (clad) layer 86 are, for example, p-type $Al_{0.9}GaAs$ with an impurity concentration of $5 \times 10^{17}/cm^3$. The Al composition may be changed in a range of 0-1. They may be GaInP or the like.

The n cathode (clad) layer 88 is, for example, n-type $Al_{0.9}GaAs$ with an impurity concentration of $5 \times 10^{17}/cm^3$. The Al composition may be changed in a range of 0-1. It may be GaInP or the like.

The p anode (clad) layer 86, the n cathode (clad) layer 88 and the light emitting layer 87 are set so that the light exiting from the light emitting layer 87 is trapped between the p anode (clad) layer 86 and the n cathode (clad) layer 88 and that the laser oscillation occurs between the side surfaces (end surfaces) of the light emitting layer 87. In this case, the light exits from the side surfaces (end surfaces) of the light emitting layer 87.

Therefore, the n ohmic electrode 321 is provided on the entire surface on the n cathode (clad) layer 88.

In FIG. 15, the light exit direction is shown as a direction orthogonal to the y direction, that is, the −x direction shown in (a) of FIG. 6. This is because of convenience of explanation and the light may exit in the −y direction. Moreover, the light may be directed in a direction vertical to the substrate 80 through a mirror or the like. The same applies to the other light emitting chips C and the modifications.

Since the provision of the current constricting layer 86b suppresses the power consumed by the non-emission recombination, consumed power reduction and light extraction efficiency improve.

The light emitting chips C according to the second exemplary embodiment are manufactured by partly changing the manufacturing method shown in FIG. 12 in the first exemplary embodiment. That is, in the semiconductor laminate forming step of (a) of FIG. 12, the lower side p layer 86a and the upper side p layer 86c of the p anode layer 86 are formed as clad layers. Likewise, the n cathode layer 88 is formed as a clad layer.

The light emitting chips C according to the second exemplary embodiment operate according to the timing chart of FIG. 11 as described in the first exemplary embodiment.

The current constricting layer 86b provided in the p anode (clad) layer 86 of the laser diode LD may be provided in the n cathode (clad) layer 88 of the laser diode LD, or may be provided in the p anode layer 81 or the n cathode layer 84 of the setting thyristor S.

Third Exemplary Embodiment

On the light emitting chip C according to a third exemplary embodiment, instead of the light emitting diodes LED in the first exemplary embodiment and the laser diodes LD in the second exemplary embodiment, vertical cavity surface emitting lasers (VCSEL) are used as the light emitting devices.

Except for the light emitting chip C, the remaining structure is similar to that of the first exemplary embodiment. Therefore, the light emitting chip C will be described, and description of similar portions is omitted.

Figure 16:
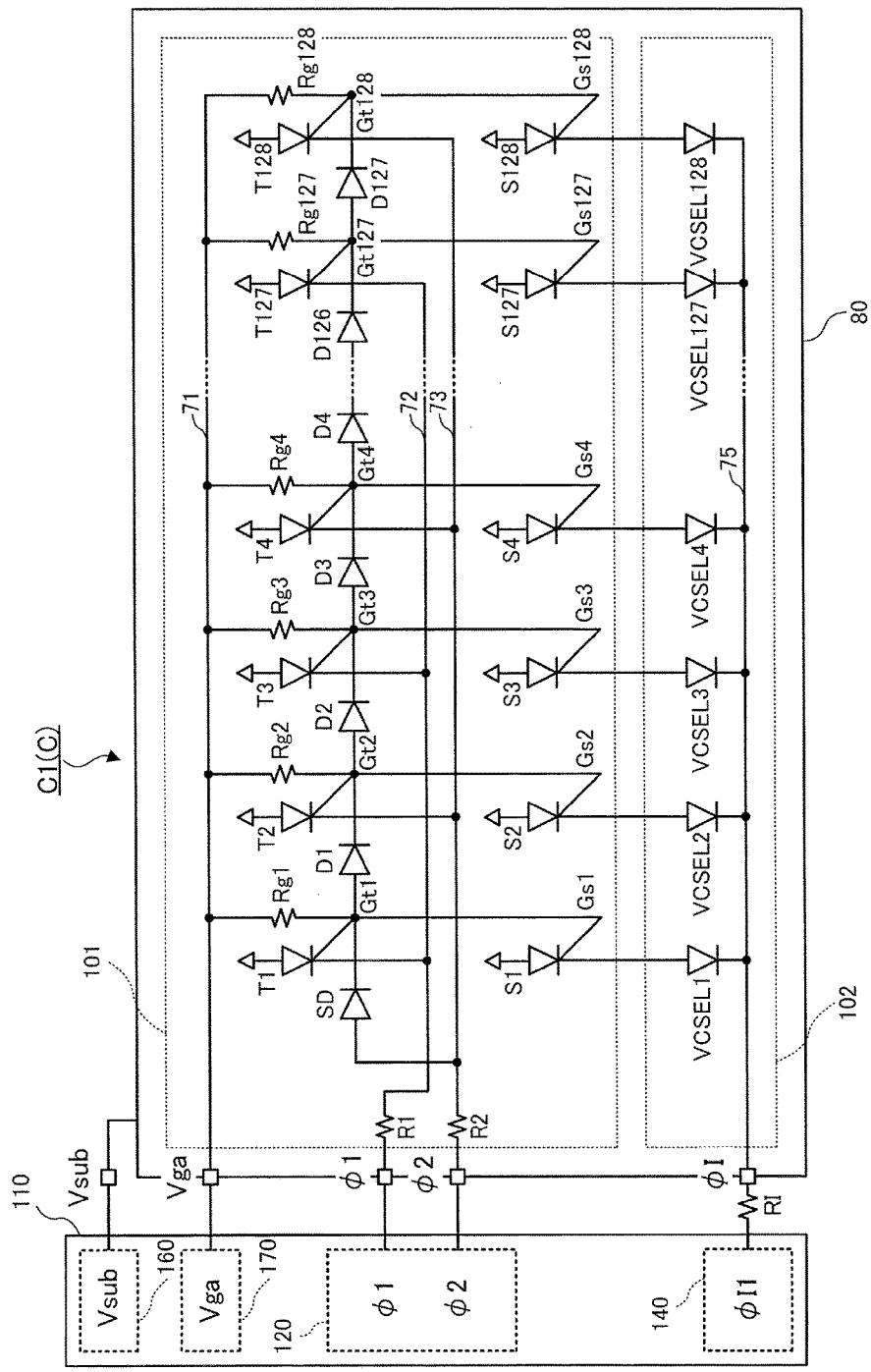
FIG. 16 is an equivalent circuit diagram for explaining the circuit configuration of the light emitting chip mounted with a self-scanning type light emitting device array (SLED) according to the third exemplary embodiment.

FIG. 16 is an equivalent circuit diagram for explaining the circuit configuration of the light emitting chip C mounted with a self-scanning type light emitting device array (SLED) according to the third exemplary embodiment. The light emitting diodes LED1-LED128 of FIG. 5 according to the first exemplary embodiment are vertical cavity surface emitting lasers VCSEL1-VCSEL128 (referred to as vertical cavity surface emitting laser VCSEL when not distinguished from one another). Description of the remaining structure which is similar to FIG. 5 is omitted.

Moreover, in the first exemplary embodiment, the light emitting diodes LED are replaced with the vertical cavity surface emitting lasers VCSEL also in the planar layout view and the cross-sectional view of the light emitting chip C shown in FIG. 6. Therefore, the planer layout view and the cross-sectional view of the light emitting chip C according to the fourth exemplary embodiment are omitted.

Figure 17:
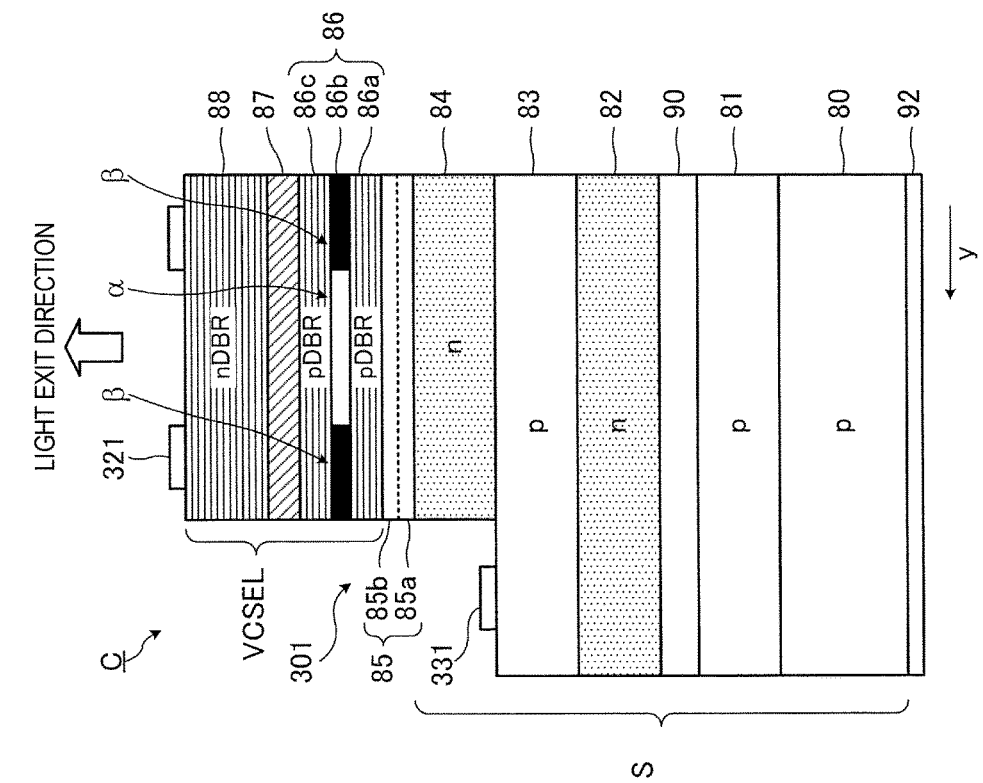
FIG. 17 is an enlarged cross-sectional view of the island of the light emitting chip according to the third exemplary embodiment where the setting thyristor and a vertical cavity surface emitting laser are laminated.

FIG. 17 is an enlarged cross-sectional view of the island 301 of the light emitting chip C according to the third exemplary embodiment where the setting thyristor S and the vertical cavity surface emitting laser VCSEL are laminated.

The setting thyristor S and the vertical cavity surface emitting laser VCSEL are laminated (VCSEL on Thyristor).

On the light emitting chip C according to the third exemplary embodiment, the p anode layer 86 and the n cathode layer 88 are formed as distributed Bragg reflector (DBR) layers (hereinafter, referred to as DBR layers). The p anode layer 86 includes the current constricting layer 86b. That is, in the p anode layer 86, the lower side p layer 86a, the current constricting layer 86b and the upper side p layer 86c are laminated in this order, and the lower side p layer 86a and the upper side p layer 86c are formed as DBR layers.

The lower side p layer 86a, the upper side p layer 86c and the n cathode layer 88 are sometimes referred to as lower side p (DBR) layer 86a, upper side p (DBR) layer 86c and n (DBR) cathode layer 88.

The DBR layers are formed of a combination of a low refractive index layer of a high Al composition of, for example, $Al_{0.9}Ga_{0.1}As$ and a high refractive index layer of a low Al composition of, for example, $Al_{0.2}Ga_{0.8}As$. The film thickness (optical path length) of the low refractive index layer and the high refractive index layer is set, for example, to 0.25 (¼) of the central wavelength. The Al composition ratio between the low refractive index layer and the high refractive index layer may be changed in a range of 0-1.

The film thickness (optical path length) of the current constricting layer 86b is determined according to the adopted structure. When importance is placed on the extraction efficiency and the process reproducibility, it is preferably set to the integral multiple of the film thickness (optical path length) of the low refractive index layer and the high refractive index layer forming the DBR layers, and is set, for example, to 0.75 (¾) of the central wavelength. In the case of an odd multiple, the current constricting layer 86b is preferably sandwiched between a high refractive index layer and a high refractive index layer. Moreover, in the case of an even multiple, the current constricting layer 86b is preferably sandwiched between a high refractive index layer and a low refractive index layer. That is, the current constricting layer 86b is preferably provided so as to suppress the disturbance of the period of the refractive index by the DBR layers. Conversely, when the influence (refractive index or distortion) of the oxidized part is to be reduced, the film thickness of the current constricting layer 86b is preferably several tens of nm, and is preferably inserted in the part of the node of the standing wave that stands within the DBR layers.

The DBR layers may be dielectric multi-layer reflecting mirrors formed of a combination of $Si_xN_y$, $SiO_2$, $Ti_xO_y$, and the like. Moreover, the DBR layers may be high contrast gratings. Moreover, part of the semiconductor layer such as part of each of the p anode layer 86 and the n cathode layer 88 may be made the DBR layers. The same applies in the other exemplary embodiments.

In the vertical cavity surface emitting laser VCSEL, at the light emitting layer 87 sandwiched between the two DBR layers [the p anode (DBR) layer 86 and the n cathode (DBR) layer 88], light is caused to resonate to cause laser oscillation. When the reflectance with the two DBR layers [the p anode (DBR) layer 86 and the n cathode (DBR) layer 88] becomes, for example, not less than 99%, laser oscillation occurs.

In the vertical cavity surface emitting laser VCSEL, since the p anode (DBR) layer 86 is present between the tunnel junction layer 85 and the light emitting layer 87, light does not reach the tunnel junction layer 85. Therefore, the bandgap of the tunnel junction layer 85 may be smaller than the oscillation wavelength. Therefore, resistance reduction can be achieved.

The light emitting chip C according to the third exemplary embodiment operates according to the timing chart of FIG. 11 as described in the first exemplary embodiment.

The current constricting layer 86b provided in the p anode (DBR) layer 86 of the vertical cavity surface emitting laser VCSEL may be provided in the n cathode (DBR) layer 88 of the vertical cavity surface emitting laser VCSEL, or may be provided in the p anode layer 81 or the n cathode layer 84 of the setting thyristor S. In this case, a certain amount of light passes through the tunnel junction layer 85. Accordingly, in order to reduce the light absorption at the tunnel junction layer 85, a material the bandgap of which is larger than the oscillation wavelength may be used for the tunnel junction layer 85, the film thickness of the tunnel junction layer 85 may be reduced, or the tunnel junction layer 85 may be situated at the node of the standing wave. Moreover, since the voltage reducing layer 90 also has light absorptiveness, when a structure through which a certain amount of light passes is used, the film thickness of the voltage reducing layer 90 may be reduced, or the voltage reducing layer 90 may be situated at the node of the standing wave.

In the first exemplary embodiment to the third exemplary embodiment, the light emitting device (the light emitting diode LED, the laser diode LD, the vertical cavity surface emitting laser VCSEL) and the setting thyristor S are laminated through the tunnel junction layer 85 so as to be connected in series. The light emitting device (the light emitting diode LED, the laser diode LD, the vertical cavity surface emitting laser VCSEL) and the setting thyristor S may be connected in series by wirings or the like instead of the tunnel junction layer 85. Moreover, a structure may be used in which epitaxial growth is caused between the light emitting device (the light emitting diode LED, the laser diode LD, the vertical cavity surface emitting laser VCSEL) and the setting thyristor S to inhibit the pn junction from being reverse-biased.

Moreover, in the first exemplary embodiment to the third exemplary embodiment, p-type GaAs is mainly described as an example of the substrate 80. Examples of semiconductor layers (the semiconductor laminate formed in the semiconductor laminate forming step of (a) of FIG. 12) in cases where different substrates are used will be described.

First, an example of the semiconductor laminate in a case where a GaN substrate is used is as follows:

The p anode layer 81 is, for example, p-type Al0.9GaN with an impurity concentration of $1 \times 10^{18}/cm^3$. The Al composition may be changed in a range of 0-1.

The voltage reducing layer 90 is, for example, an InN quantum dot.

The n gate layer 82 is, for example, n-type Al0.9GaN with an impurity concentration of $1 \times 10^{17}/cm^3$. The Al composition may be changed in a range of 0-1.

The p gate layer 83 is, for example, p-type Al0.9GaN with an impurity concentration of $1 \times 10^{17}/cm^3$. The Al composition may be changed in a range of 0-1.

The n cathode layer 84 is, for example, n-type Al0.9GaN with an impurity concentration of $1 \times 10^{18}/cm^3$. The Al composition may be changed in a range of 0-1.

The tunnel junction layer 85 is formed of a junction of the $n^{++}$ layer 85a to which an n-type impurity is added at a high concentration and the $p^{+-}$ layer 85b to which an n-type impurity is added at a high concentration (see (b) of FIG. 12). The $n^{+-}$ layer 85a and the $p^{+-}$ layer 85b are high in concentration, for example, with an impurity concentration of $1 \times 1020/cm^3$. The impurity concentration of a normal junction is on the order of $10^{17}/cm^3$—on the order of $10^{18}/cm^3$. Combinations of the $n^{++}$ layer 85a and the $p^{++}$ layer 85b (hereinafter, referred to as $n^{++}$ layer 85a/$p^{++}$ layer 85b) are, for example, $n^{++}$GaN/$p^{++}$GaN, $n^{++}$GaInN/$p^{++}$GaInN, $n^{++}$AlGaN/$p^{++}$AlGaN). Combinations interchanged with each other may be used.

The p anode layer 86 is formed by sequentially laminating the lower side p layer 86a, the current constricting layer 86b and the upper side p layer 86c (see (c) of FIG. 12).

The lower side p layer 86a and the upper side p layer 86c are, for example, p-type Al0.9GaN with an impurity concentration of $1 \times 10^{18}/cm^3$. The Al composition may be changed in a range of 0-1.

Since it is difficult to use a constricting layer due to oxidation (oxidized constricting layer) as the current constricting layer on the GaN substrate, it is preferable to use a tunnel junction, a ridge structure or an embedded structure as the current constricting layer. Alternatively, the current constricting layer may be formed by ion implantation.

The light emitting layer 87 has a quantum well structure where well layers and barrier layers are laminated alternately. The well layers are, for example, GaN, InGaN or AlGaN, and the barrier layers are AlGaN or GaN. The light emitting layer 87 may be a quantum line (quantum wire) or a quantum box (quantum dot).

The n cathode layer 88 is, for example, n-type Al0.9GaN with an impurity concentration of $1 \times 10^{18}/cm^3$. The Al composition may be changed in a range of 0-1.

Next, an example of the semiconductor laminate in a case where an InP substrate is used is as follows:

The p anode layer 81 is, for example, p-type InGaAsP with an impurity concentration of $1 \times 10^{18}/cm^3$. The Ga composition and the Al composition may be changed in a range of 0-1.

The voltage reducing layer 90 is, for example, a compound of GaAs and Inp, a compound of InN and InSb or a compound of InN and InAs that is low in bandgap energy. A GaInNAs-based compound semiconductor may be used as long as it is a quaternary or higher mixture.

The n gate layer 82 is, for example, n-type InGaAsP with an impurity concentration of $1 \times 10^{17}/cm^3$. The Ga composition and the Al composition may be changed in a range of 0-1.

The p gate layer 83 is, for example, p-type InGaAsP with an impurity concentration of $1 \times 10^{17}/cm^3$. The Ga composition and the Al composition may be changed in a range of 0-1.

The n cathode layer 84 is, for example, n-type InGaAsP with an impurity concentration of $1 \times 10^{18}/cm^3$. The Ga composition and the Al composition may be changed in a range of 0-1.

The tunnel junction layer 85 is formed of a junction of the $n^{++}$ layer 85a to which an n-type impurity is added at a high concentration and the $p^{+-}$ layer 85b to which an n-type impurity is added at a high concentration (see (b) of FIG. 12). The $n^{++}$ layer 85a and the $p^{+-}$ layer 85b are high in concentration, for example, with an impurity concentration of $1 \times 1020/cm^3$. The impurity concentration of a normal junction is on the order of $10^{17}/cm^3$—on the order of $10^{18}/cm^3$. Combinations of the $n^{++}$ layer 85a and the $p^{++}$ layer 85b (hereinafter, referred to as $n^{++}$ layer 85a/$p^{++}$ layer 85b) are, for example, $n^{++}$InP/$p^{++}$InP, $n^{++}$InAsP/$p^{++}$InAsP, $n^{++}$InGaAsP/$p^{++}$InGaAsP and $n^{++}$InGaAsPSb/$p^{++}$InGaAsPSb. Combinations interchanged with each other may be used.

The p anode layer 86 is formed by sequentially laminating the lower side p layer 86a, the current constricting layer 86b and the upper side p layer 86c (see (c) of FIG. 12).

The lower side p layer 86a and the upper side p layer 86c are, for example, p-type InGaAsP with an impurity concentration of $1 \times 10^{18}/cm^3$. The Ga composition and the Al composition may be changed in a range of 0-1.

Since it is difficult to use a constricting layer due to oxidation (oxidized constricting layer) as the current constricting layer on the InP substrate, it is preferable to use a tunnel junction, a ridge structure or an embedded structure as the current constricting layer. Alternatively, the current constricting layer may be formed by ion implantation.

The light emitting layer 87 has a quantum well structure where well layers and barrier layers are laminated alternately. The well layers are, for example, InAS, InGaAsP, AlGaInAS or GaInAsPSb, and the barrier layers are InP, InAsP, InGaAsP or AlGaInAsP. The light emitting layer 87 may be a quantum line (quantum wire) or a quantum box (quantum dot).

The n cathode layer 88 is, for example, n-type InGaAsP with an impurity concentration of $1\times10^{18}/cm^3$. The Ga composition and the Al composition may be changed in a range of 0-1.

These semiconductor layers are laminated, for example, by the metal organic chemical vapor deposition (MOCVD) method or the molecular beam epitaxy (MBE) method to form a semiconductor laminate.

Fourth Exemplary Embodiment

In the first exemplary embodiment to the fourth exemplary embodiment, the light emitting device (the light emitting diode LED, the laser diode LD, the vertical cavity surface emitting laser VCSEL) and the setting thyristor S are laminated through the tunnel junction layer 85 so as to be connected in series.

Instead of the tunnel junction layer 85, a III-V compound layer having metallic conductivity may be used.

Figure 18:
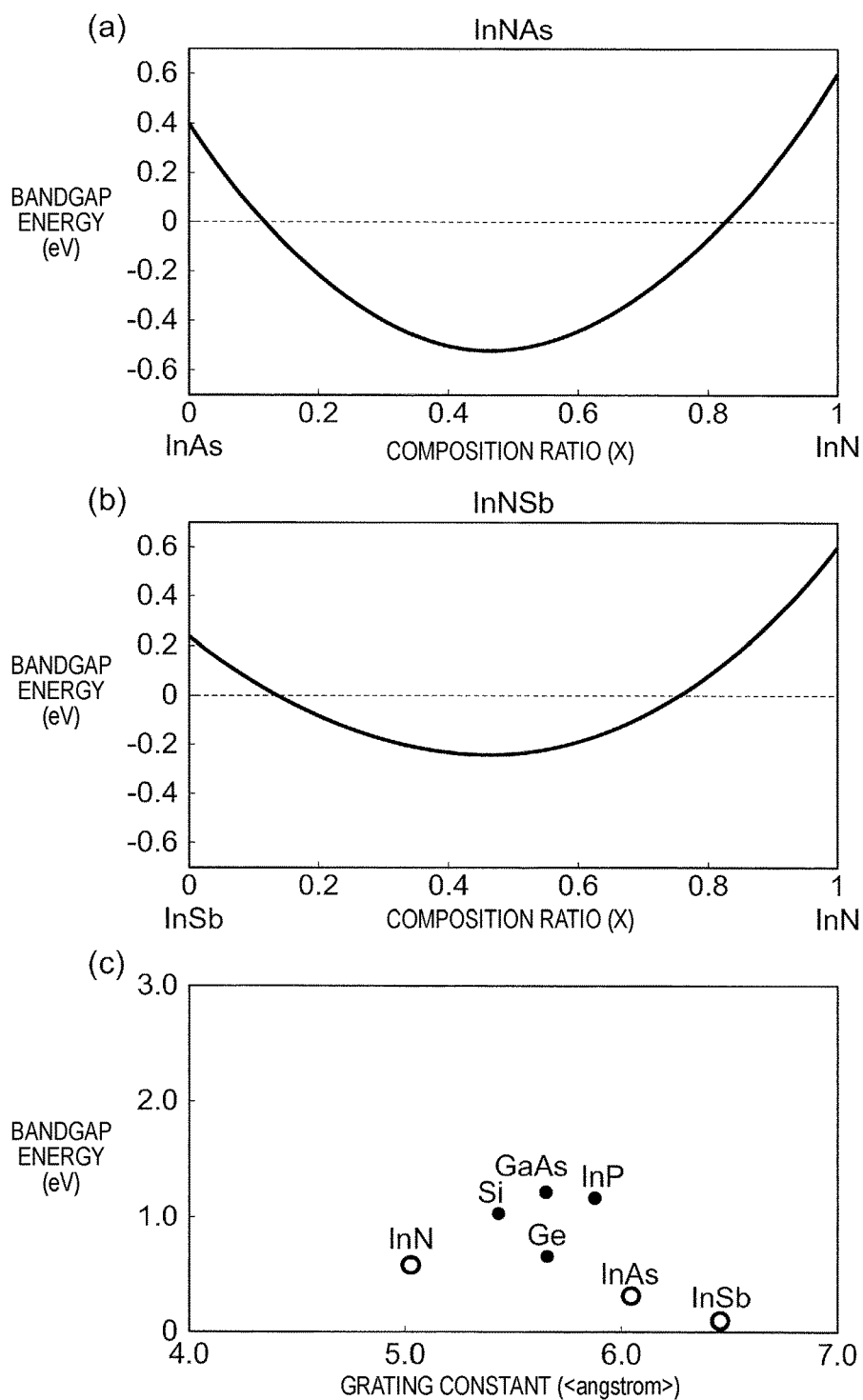
FIG. 18 is views, in which (a) is the bandgap of InNAs with respect to the composition ratio x of InN, (b) is the bandgap of InNSb with respect to the composition ratio x of InN, and (c) is a view showing the grating constants of VI elements and III-V compounds with respect to the bandgap.

FIG. 18 is views explaining the materials forming the metallic conductive III-V compound layer 85. (a) of FIG. 18 is the bandgap of InNAs with respect to the composition ratio x of InN, (b) of FIG. 18 is the bandgap of InNSb with respect to the composition ratio x of InN, and (c) of FIG. 18 is a view showing the grating constants of VI elements and III-V compounds with respect to the bandgap.

(a) of FIG. 18 shows the bandgap energy (eV) with respect to InNAs which is a compound of InN with a composition ratio x (x=0–1) and InAs with a composition ratio (1–x).

(b) of FIG. 18 shows the bandgap energy (eV) with respect to InNSb which is a compound of InN with a composition ratio x (x=0–1) and InSb with a composition ratio (1–x).

It is known that the bandgap energies of InNAs and InNSb described as an example of the materials of the metallic conductive III-V compound layer 85 become negative in a certain range of the composition ratio x as shown in (a) and (b) of FIG. 18. That the bandgap energy becomes negative means that no bandgap is possessed. Therefore, a conductive property (conducting property) similar to that of metal is exhibited. That is, the metallic conductive property (conductivity) indicates that current flows if the potential has a gradient similarly to metal.

As shown in (a) of FIG. 18, the bandgap energy of InNAs becomes negative, for example, in a range of the composition ratio x of InN of approximately 0.1-approximately 0.8.

As shown in (b) of FIG. 18, the bandgap energy of InNSb becomes negative, for example, in a range of the composition ratio x of InN of approximately 0.2-approximately 0.75.

That is, InNAs and InNSb exhibit metallic conductive property (conductivity) in the above-mentioned ranges.

The region outside the above-mentioned ranges where the bandgap energy is low has, since electrons have energy because of thermal energy, a characteristic in that it is possible to transit a slight bandgap and when the bandgap energy is negative and when the potential has a gradient similarly to metal, current easily flows.

Even if Al, Ga, Ag, P or the like is contained in InNAs and InNSb, the bandgap energy can be maintained in the neighborhood of 0 or negative depending on the composition, and current flows if the potential has a gradient.

Further, InNAs and InNSb can be epitaxially grown for the layer of a III-V compound (semiconductor) such as GaAs. Moreover, a layer of a III-V compound (semiconductor) such as GaAs can be epitaxially grown on the layer of InNAs.

Therefore, by laminating the light emitting device (the light emitting diode LED, the laser diode LD, the vertical cavity surface emitting laser VCSEL) and the setting thyristor S so as to be connected in series through the metallic conductive III-V compound layer instead of the tunnel junction layer 85, then cathode layer 84 between the light emitting device and the setting thyristor S and the p anode layer 86 of the light emitting diode LED are inhibited from being reverse-biased.

When the light emitting device (the light emitting diode LED, the laser diode LD, the vertical cavity surface emitting laser VCSEL) and the setting thyristor S are laminated without the tunnel junction layer 85 or the metallic conductive III-V compound layer being interposed, the n cathode layer 84 of the setting thyristor S and the p anode layer 86 of the light emitting diode LED are reverse-biased. For this reason, the application of a high voltage that makes the reverse-biased junction (the junction of then cathode layer 84 and the p anode layer 86) yield is required.

That is, if the metallic conductive III-V compound layer is used, as in the case where the tunnel junction layer 85 is used, the application of a high voltage that makes the reverse-biased junction (the junction of the n cathode layer 84 and the p anode layer 86) yield is not required.

The metallic conductive III-V compound layer is applicable to the light emitting chips C in the first exemplary embodiment to the third exemplary embodiment. That is, the tunnel junction layer 85 is replaced with the metallic conductive III-V compound layer. Moreover, it is similarly applicable to the semiconductor layers in the above-described cases where the different substrates are used instead of p-type GaAs. Therefore, detailed description is omitted.

Fifth Exemplary Embodiment

A fifth exemplary embodiment is an optical thyristor P. When light is applied, the optical thyristor P turns on.

Figure 19:
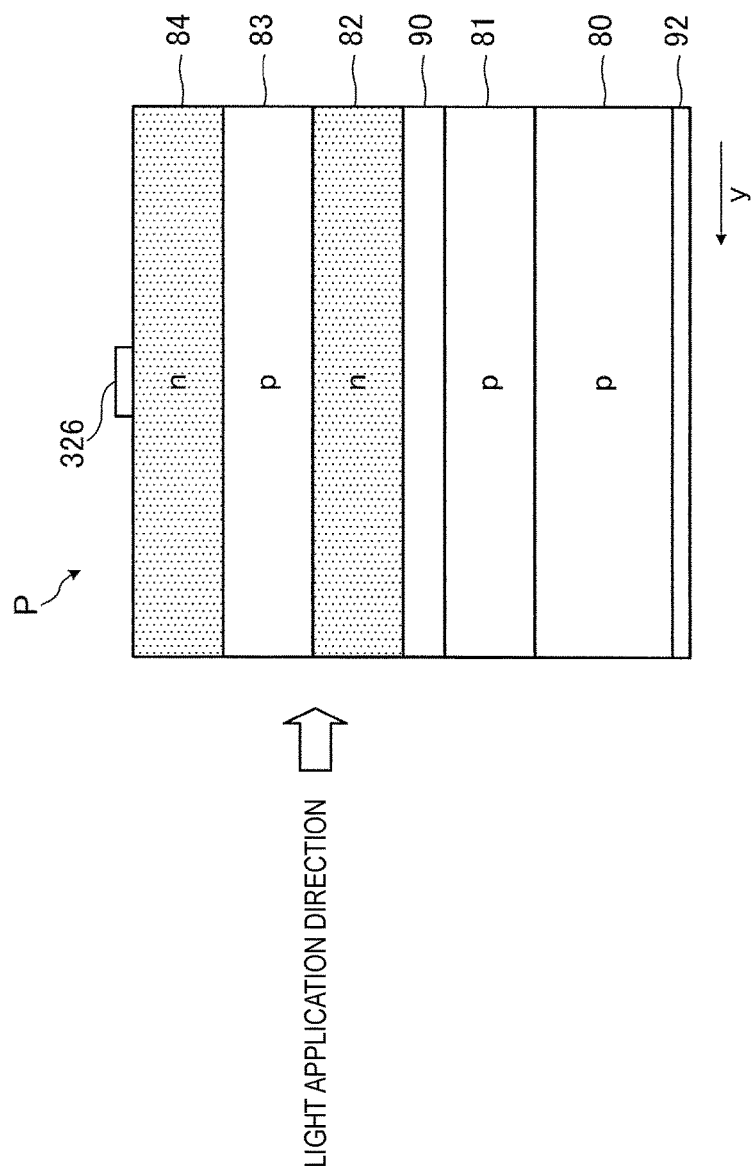
FIG. 19 is an enlarged cross-sectional view of an optical thyristor according to a fifth exemplary embodiment.

FIG. 19 is an enlarged cross-sectional view of the optical thyristor P according to the fifth exemplary embodiment. It is a view showing a cross-sectional structure of the optical thyristor P.

The optical thyristor P is formed by the p anode layer 81, the voltage reducing layer 90, the n gate layer 82, the p gate layer 83 and the n cathode layer 84 being laminated on the substrate 80. On the reverse surface of the substrate 80, the reverse side electrode 92 is provided, and on the n cathode layer 84, an n ohmic electrode 326 is provided.

The optical thyristor P turns on when one or both of the n gate layer 82 and the p gate layer 83 absorb light.

The optical thyristor P is low in rising voltage since it is provided with the voltage reducing layer 90. That is, the optical thyristor P is low in the voltage that maintains ON state. Therefore, the consumed power of the optical thyristor P is suppressed.

Moreover, the voltage reducing layer 90 functions also as a light absorbing layer since it is low in bandgap energy. Therefore, the optical thyristor P easily operates even if the intensity of the input light is low.

The optical thyristor P like this is applicable to optical computing, optical arithmetic processing and the like. In these cases, by using the optical thyristor P according to the fifth exemplary embodiment, consumed power can be suppressed.

Further, by providing the thyristor used for an electric circuit such as for power with the voltage reducing layer 90 described in the first exemplary embodiment to the fifth exemplary embodiment, a thyristor where the consumed power in ON state is suppressed is obtained. Since the structure is similar to that of the transfer thyristor T shown in (a) and (b) of FIG. 6, description thereof is omitted.

In the first exemplary embodiment to the fourth exemplary embodiment, the conductivity types of the light emitting diode (the light emitting diode LED, the laser diode LD, the vertical cavity surface emitting laser VCSEL) and the thyristors (the transfer thyristor T, the setting thyristor S) may be reversed and the polarity of the circuit may be changed. That is, anode common may be made cathode common.

In order to suppress light emission delay and relaxation oscillation when the light emitting device (the light emitting diode LED, the laser diode LD, the vertical cavity surface emitting laser VCSEL) turns on, the light emitting device may be previously implanted with minute current of not less than threshold current so as to be in slightly light emitting state or oscillating state. That is, a structure may be adopted in which the light emitting device is caused to slightly emit light or oscillate from before the setting thyristor S turns on and when the setting thyristor S turns on, the emission amount of the light emitting device is increased so as to be a predetermined emission amount. As such a structure, for example, an electrode is formed on the anode layer of the light emitting device (the light emitting diode LED, the laser diode LD, the vertical cavity surface emitting laser VCSEL), a voltage source or a current source is connected to this electrode and from before the setting thyristor S turns on, minute current is implanted to the light emitting device from this voltage source or current source.

Further, while description is given with the self-scanning type light emitting device array (SLED) formed of the light emitting device (the light emitting diode LED, the laser diode LD, the vertical cavity surface emitting laser VCSEL) and the thyristor (the transfer thyristor T, the setting thyristor S) in the above, the self-scanning type light emitting device array (SLED) may include other members such as a thyristor for control, a diode and a resistor in addition to the above.

Moreover, while the transfer thyristors T are interconnected by the coupling diodes D, they may be interconnected by members such as resistors that are capable of transmitting a potential change.

The structure of the setting thyristor S in the first exemplary embodiment to the fourth exemplary embodiment may be other than the four-layer structure of pnpn as long as it is a structure having the function of the setting thyristor S in the exemplary embodiments. For example, it may be a pinin structure, a pipin structure, an npip structure, a pnin structure or the like having the thyristor property may be adopted. Likewise, the transfer thyristor T may also be other than the four-layer structure of pnpn as long as it is a structure having the function of the transfer thyristor T in the exemplary embodiments. For example, a pinin structure, a pipin structure, an npip structure, a pnin structure or the like having the thyristor property may be adopted. In this case, any of the i layer, the n layer and the i layer sandwiched between the p layer and the n layer of the pinin structure, the n layer and the i layer sandwiched between the p layer and the n layer of the pnin structure becomes the gate layer, and the n ohmic electrode 332 provided on the gate layer is made the terminal of the gate Gt (the gate Gs). Alternatively, any of the i layer, the p layer and the i layer sandwiched between the n layer and the p layer of the nipip structure and the p layer and the i layer sandwiched between the n layer and the p layer of the npip structure becomes the gate layer, and the p ohmic electrode 332 provided on the gate layer is made the terminal of the gate Gt (the gate Gs).

Further, the voltage reducing layer 90 may be inserted as part of any of the layers. It may have an impurity similar to the layer into which it is inserted, may have a similar conductivity type or may be the i type.

Moreover, the same applies to the optical thyristor P described in the fifth exemplary embodiment.

In the first exemplary embodiment to the fourth exemplary embodiment, the conductivity types of the light emitting device (the light emitting diode LED, the laser diode LD, the vertical cavity surface emitting laser VCSEL) and the thyristor (the transfer thyristor T, the setting thyristor S) may be reversed and the polarity of the circuit may be changed. That is, anode common may be made cathode common.

The semiconductor structure in which plural semiconductor layers including the voltage reducing layer 90 which layers form the thyristor and plural semiconductor layers forming the light emitting device are laminated through a semiconductor layer forming the tunnel junction layer 85 or the metallic conductive III-V compound layer in the exemplary embodiments may be used for uses other than the self-scanning type light emitting device array (SLED). For example, it may be used as a stand-alone light emitting device that is lit by the input of an electric signal, an optical signal or the like from the outside or alight emitting device array other than the self-scanning type light emitting device array.

While the present invention has been described in detail and with reference to specific exemplary embodiments, it is obvious to one of ordinary skill in the art that various changes and modifications may be added without departing from the spirit and scope of the present invention.

DESCRIPTION OF REFERENCE NUMERALS AND SIGNS

1: Image forming apparatus; 10: image forming process portion; 11: image forming unit; 12: photoreceptor drum; 14: print head; 30: image output controller; 40: image processor; 62: circuit board; 63: light source portion; 64: rod lens array: 65: light emitter; 80: substrate; 81: p anode layer; 82: n gate layer; 83: p gate layer; 84: n cathode layer; 85: tunnel junction layer; 85a: $n^{++}$ layer; 85b: $p^{+-}$ layer; 86: p anode layer; 86b: current constricting layer; 87: light emitting layer; 88: n cathode layer; 89: light exit port protecting layer; 90:voltage reducing layer; 91: protecting layer; 92: reverse side electrode; 101: transfer portion; 102: light emitting portion; 110: signal generating circuit; 120: transfer signal generating portion; 140: lighting signal generating portion; 160: reference potential supplying portion; 170: power source potential supplying portion; 301-306: island; φ1: first transfer signal; φ2: second transfer signal; φI (φI1-φI40): lighting signal; α: current passing portion (area); β: current blocking portion (area); C(C1-C40): light emitting chip; D(D1-D127): coupling diode; LED (LED1-LED128): light emitting diode; LD (LD1-LD128): laser diode; SD: start diode; T(T1-T128): transfer thyristor; VCSEL(VCSEL1-VCSEL128): vertical cavity surface emitting laser; Vga: power source potential; Vsub: reference potential.

The invention claimed is:
1. A light emitting component comprising:
   a plurality of transfer devices that successively come into ON state;
   a plurality of setting thyristors that are connected to the plurality of transfer devices, respectively, and come into a state of being able to shift to ON state by the transfer devices coming into ON state; and a plurality of light emitting devices that are laminated on the plurality of setting thyristors so as to be connected to the plurality of setting thyristors in series, respectively, and emit light when the setting thyristors come into ON state, wherein the setting thyristors comprise a plurality of semiconductor layers including one of an anode layer and a cathode layer, a voltage reducing layer, a first gate layer, a second gate layer, and the other of the anode layer and the cathode layer which are laminated in order from a substrate, and electrodes connecting to the plurality of transfer devices are provided on the second gate layer, and wherein the voltage reducing layer has a bandgap smaller than bandgaps of light emitting layers of the light emitting devices.

2. The light emitting component according to claim 1, wherein the transfer devices are formed from the thyristors comprising the voltage reducing layer.

3. The light emitting component according to claim 2, wherein the light emitting devices and the setting thyristors are laminated through a tunnel junction, and the tunnel junction is formed so as to be set to reverse bias when the light emitting devices are set to forward bias.

4. The light emitting component according to claim 3, wherein any semiconductor layer of the plurality of semiconductor layers forming the setting thyristors, a plurality of semiconductor layers forming the light emitting devices and a semiconductor layer forming the tunnel junction constricts current paths at the light emitting devices.

5. The light emitting component according to claim 4, wherein at least part of at least one semiconductor layer of the plurality of semiconductor layers forming the setting thyristors and a plurality of semiconductor layers forming the light emitting devices is a distributed Bragg reflector layer.

6. The light emitting component according to claim 3, wherein at least part of at least one semiconductor layer of the plurality of semiconductor layers forming the setting thyristors and a plurality of semiconductor layers forming the light emitting devices is a distributed Bragg reflector layer.

7. The light emitting component according to claim 2, wherein the light emitting devices and the setting thyristors are laminated through a III-V compound layer having metallic conductivity.

8. The light emitting component according to claim 7, wherein any semiconductor layer of the plurality of semiconductor layers forming the setting thyristors, a plurality of semiconductor layers forming the light emitting devices and a semiconductor layer forming the III-V compound layer having metallic conductivity constricts current paths at the light emitting devices.

9. The light emitting component according to claim 2, wherein at least part of at least one semiconductor layer of the plurality of semiconductor layers forming the setting thyristors and a plurality of semiconductor layers forming the light emitting devices is a distributed Bragg reflector layer.

10. The light emitting component according to claim 1, wherein the light emitting devices and the setting thyristors are laminated through a tunnel junction, and the tunnel junction is formed so as to be set to reverse bias when the light emitting devices are set to forward bias.

11. The light emitting component according to claim 10, wherein any semiconductor layer of the plurality of semiconductor layers forming the setting thyristors, a plurality of semiconductor layers forming the light emitting devices and a semiconductor layer forming the tunnel junction constricts current paths at the light emitting devices.

12. The light emitting component according to claim 11, wherein at least part of at least one semiconductor layer of the plurality of semiconductor layers forming the setting thyristors and a plurality of semiconductor layers forming the light emitting devices is a distributed Bragg reflector layer.

13. The light emitting component according to claim 10, wherein at least part of at least one semiconductor layer of the plurality of semiconductor layers forming the setting thyristors and a plurality of semiconductor layers forming the light emitting devices is a distributed Bragg reflector layer.

14. The light emitting component according to claim 1, wherein the light emitting devices and the setting thyristors are laminated through a III-V compound layer having metallic conductivity.

15. The light emitting component according to claim 14, wherein any semiconductor layer of the plurality of semiconductor layers forming the setting thyristors, a plurality of semiconductor layers forming the light emitting devices and a semiconductor layer forming the III-V compound layer having metallic conductivity constricts current paths at the light emitting devices.

16. The light emitting component according to claim 1, wherein at least part of at least one semiconductor layer of the plurality of semiconductor layers forming the setting thyristors and a plurality of semiconductor layers forming the light emitting devices is a distributed Bragg reflector layer.

17. A printer head comprising:
a light emitting portion comprising: a plurality of transfer devices that successively come into ON state; a plurality of setting thyristors that are connected to the plurality of transfer devices, respectively, and come into a state of being able to shift to ON state by the transfer devices coming into ON state; and a plurality of light emitting devices that are laminated on the plurality of setting thyristors so as to be connected to the plurality of setting thyristors in series, respectively, and emit light when the setting thyristors come into ON state; and
an optical portion that images light emitted from the light emitting portion,
wherein the setting thyristors comprise a plurality of semiconductor layers including one of an anode layer and a cathode layer, a voltage reducing layer, a first gate layer, a second gate layer, and the other of the anode layer and the cathode layer which are laminated in order from a substrate, and electrodes connecting to the plurality of transfer devices are provided on the second gate layer, and
wherein the voltage reducing layer has a bandgap smaller than bandgaps of light emitting layers of the light emitting devices.

18. An image forming apparatus comprising:
an image carrier;
a charging portion that charges the image carrier;
an exposing portion comprising: a plurality of transfer devices that successively come into ON state; a plurality of setting thyristors that are connected to the plurality of transfer devices, respectively, and come into a state of being able to shift to ON state by the transfer devices coming into ON state; and a plurality of light emitting devices that are laminated on the plurality of setting thyristors so as to be connected to the plurality of setting thyristors in series, respectively, and emit light when the setting thyristors come into ON state, and exposing the image carrier through an optical portion;

a developing portion that develops an electrostatic latent image formed on the image carrier by being exposed by the exposing portion; and a transfer portion that transfers an image developed onto the image carrier to a transfer object, wherein the setting thyristors comprise a plurality of semiconductor layers including one of an anode layer and a cathode layer, a voltage reducing layer, a first gate layer, a second gate layer, and the other of the anode layer and the cathode layer which are laminated in order from a substrate, and electrodes connecting to the plurality of transfer devices are provided on the second gate layer, and wherein the voltage reducing layer has a bandgap smaller than bandgaps of light emitting layers of the light emitting devices.

19. A light emitting component comprising:

a thyristor; and a light emitting device laminated on the thyristor so as to be connected to the thyristor through a tunnel junction, wherein the thyristor comprises a plurality of semiconductor layers including one of an anode layer and a cathode layer, a voltage reducing layer, a first gate layer, a second gate layer, and the other of the anode layer and the cathode layer which are laminated in order from a substrate, a layer of the plurality of semiconductor layers of the thyristor has a bandgap smaller than a bandgap of a light emitting layer of the light emitting device, and the tunnel junction is formed so as to be set to reverse bias when the light emitting device is set to forward bias.

20. A light emitting component comprising:

a thyristor; and a light emitting device laminated on the thyristor so as to be connected to the thyristor through a III-V compound layer having metallic conductivity, wherein the thyristor comprises a plurality of semiconductor layers including one of an anode layer and a cathode layer, a voltage reducing layer, a first gate layer, a second gate layer, and the other of the anode layer and the cathode layer which are laminated in order from a substrate, and electrodes connecting to the plurality of transfer devices are provided on the second gate layer, and a layer of the plurality of semiconductor layers of the thyristor has a bandgap smaller than a bandgap of a light emitting layer of the light emitting device.

* * * * *